(12) United States Patent
Hao et al.

(10) Patent No.: US 9,064,726 B2
(45) Date of Patent: Jun. 23, 2015

(54) LOW-COST CMOS STRUCTURE WITH DUAL GATE DIELECTRICS AND METHOD OF FORMING THE CMOS STRUCTURE

(71) Applicant: Texas Instruments Incorporated, Dallas, TX (US)

(72) Inventors: Pinghai Hao, Plano, TX (US); Sameer Pendharkar, Allen, TX (US); Amitava Chatterjee, Plano, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 13/789,477

(22) Filed: Mar. 7, 2013

(65) Prior Publication Data

US 2014/0252485 A1    Sep. 11, 2014

(51) Int. Cl.
*H01L 21/20*    (2006.01)
*H01L 21/8238*  (2006.01)
*H01L 27/11*    (2006.01)
*H01L 29/66*    (2006.01)
*H01L 27/092*   (2006.01)

(52) U.S. Cl.
CPC ...... *H01L 27/092* (2013.01); *H01L 21/823807* (2013.01); *H01L 21/823857* (2013.01)

(58) Field of Classification Search
CPC . H01L 21/26513; H01L 21/02; H01L 29/772; H01L 27/0629; H01L 29/8605; H01L 29/02; H01L 27/06; H01L 27/02; H01L 27/0203; H01L 21/823857; H01L 21/823807; H01L 27/092
USPC ........... 257/379, E21.001, E21.002, E21.003, 257/E21.004, 365; 438/382, 217
See application file for complete search history.

(56) References Cited

U.S. PATENT DOCUMENTS

| | | | |
|---|---|---|---|
| 2002/0187596 A1* | 12/2002 | Yamanaka et al. | 438/197 |
| 2003/0022434 A1* | 1/2003 | Taniguchi et al. | 438/240 |
| 2006/0151840 A1* | 7/2006 | Maekawa | 257/384 |
| 2009/0108370 A1* | 4/2009 | Tsukamoto | 257/369 |
| 2011/0223732 A1* | 9/2011 | Griebenow et al. | 438/275 |

* cited by examiner

*Primary Examiner* — Chuong A Luu
*Assistant Examiner* — Moazzam Hossain
(74) *Attorney, Agent, or Firm* — Jacqueline J. Garner; Frank Cimino

(57) ABSTRACT

Impurity atoms of a first type are implanted through a gate and a thin gate dielectric into a channel region that has substantially only the first type of impurity atoms at a middle point of the channel region to increase the average dopant concentration of the first type of impurity atoms in the channel region to adjust the threshold voltage of a transistor.

6 Claims, 24 Drawing Sheets

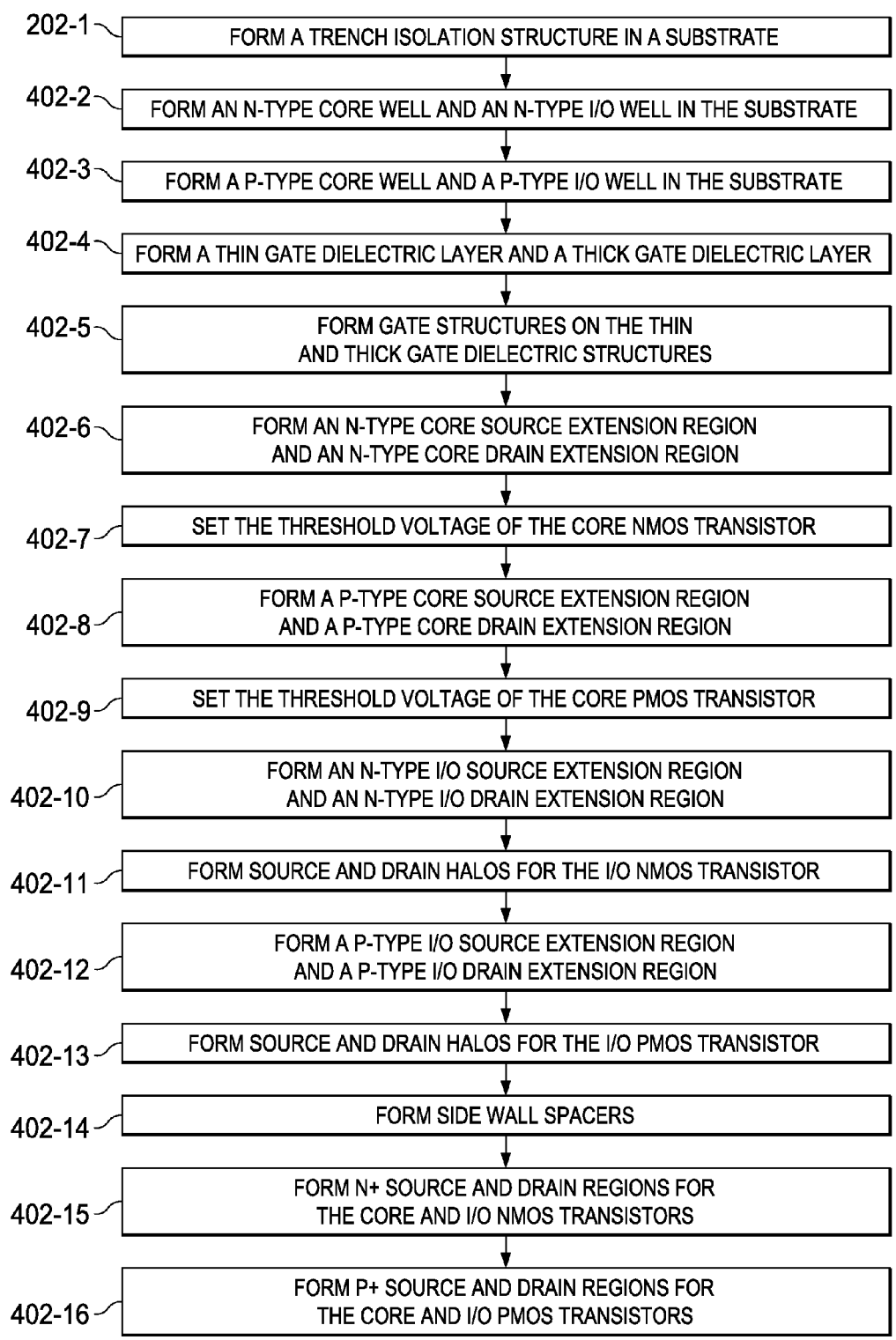

US 9,064,726 B2

LOW-COST CMOS STRUCTURE WITH DUAL GATE DIELECTRICS AND METHOD OF FORMING THE CMOS STRUCTURE

BACKGROUND OF THE INVENTION

1. Field of the Invention

The present invention relates to a CMOS structure and, more particularly, to a low-cost CMOS structure with dual gate dielectrics and a method of forming the CMOS structure.

2. Description of the Related Art

A complimentary metal oxide semiconductor (CMOS) circuit is a circuit that includes one or more n-channel (NMOS) transistors as well as one or more p-channel (PMOS) transistors. Physically, the NMOS and PMOS transistors each have spaced-apart source and drain regions, which are separated by a channel region, and a gate that lies over and is insulated from the channel region by a gate dielectric.

The source and drain regions, which are formed in a well of the opposite conductivity type, each includes an extension region and a main region that touches the extension region. The main region has a heavier dopant concentration than the extension region. The well, in turn, includes the channel region, which is a surface region of the well that touches the gate dielectric, and a below-the-channel region that touches and lies below the channel region.

Semiconductor chips commonly include two types of CMOS circuits: core CMOS circuits which perform the functionality of the chip, and input/output (I/O) CMOS circuits which connect the core CMOS circuits to the outside world. The core CMOS circuits typically operate with supply voltages that are lower than the supply voltages that are used by the I/O circuits.

When the core CMOS circuits utilize supply voltages that are lower than the supply voltages utilized by the I/O CMOS circuits, the NMOS and PMOS transistors in the core CMOS circuits are physically formed to have gate dielectrics that are thinner than the gate dielectrics of the NMOS and PMOS transistors in the I/O CMOS circuits. As a result, a CMOS structure with dual gate dielectrics is a type of CMOS structure that includes NMOS and PMOS transistors with thin gate dielectrics, and NMOS and PMOS transistors with thick gate dielectrics.

There are three common approaches to forming a CMOS structure with dual gate dielectrics. In a first approach, which is the most economical, the NMOS transistors in the core CMOS circuits and the NMOS transistors in the I/O CMOS circuits are formed as identical structures, except for the gate dielectrics, where the NMOS transistors in the core CMOS circuits have thinner gate dielectrics than the NMOS transistors in the I/O CMOS circuits. Similarly, the PMOS transistors in the core CMOS circuits and the PMOS transistors in the I/O CMOS circuits are formed as identical structures, except for the gate dielectrics, where the PMOS transistors in the core CMOS circuits have thinner gate dielectrics than the PMOS transistors in the I/O CMOS circuits.

In the first approach, a mask is used to form the gate dielectrics with two different thicknesses. For example, gate dielectric layers can be grown on each well. The growth then continues until the gate dielectric layers have reached the thickness required by the NMOS and PMOS transistors in the core CMOS circuits.

Following this, a mask is formed on the top surfaces of the gate dielectric layers to cover and protect the gate dielectric layers that lie over the wells of the NMOS and PMOS transistors of the core CMOS circuits. The mask also exposes the gate dielectric layers that lie over the wells of the NMOS and PMOS transistors of the I/O CMOS circuits. After the mask has been formed, the exposed gate dielectric layers are further grown until the gate dielectric layers over the wells of the NMOS and PMOS transistors of the I/O CMOS circuits have reached the thickness required by the NMOS and PMOS transistors in the I/O CMOS circuits.

In a second approach to forming a dual gate structure, in addition to using a mask to form the gate dielectrics with two different thicknesses as in the first approach, a pair of p-well masks is also used to form the p-type wells of the NMOS transistors. The first p-well mask of the pair exposes a substrate region where the p-type wells of the NMOS transistors in the core CMOS circuits are to be formed. The second p-well mask of the pair, which is formed after the first p-well mask has been removed, exposes a substrate region where the p-type wells of the NMOS transistors in the I/O CMOS circuits are to be formed.

As a result, when acceptor-type impurity atoms are implanted through the first and second p-well masks to form the p-type wells, the atoms are implanted so that the average dopant concentration of the channel region of each of the NMOS transistors in the core CMOS circuits is greater than the average dopant concentration of the channel region of each of the NMOS transistors in the I/O CMOS circuits.

In addition, the acceptor-type impurity atoms are also implanted through the first and second p-well masks so that the dopant profile of the below-the-channel region of each of the NMOS transistors in the core CMOS circuits is substantially different than the dopant profile of the below-the-channel region of each of the NMOS transistors in the I/O CMOS circuits.

Further, a pair of n-well masks is also used to form the n-type wells of the PMOS transistors. The first n-well mask of the pair exposes a substrate region where the n-type wells of the PMOS transistors in the core CMOS circuits are to be formed. The second n-well mask, which is formed after the first n-well mask has been removed, exposes a substrate region where the n-type wells of the PMOS transistors in the I/O CMOS circuits are to be formed.

As a result, when donor-type impurity atoms are implanted through the first and second n-well masks to form the n-type wells, the atoms are implanted so that the average dopant concentration of the channel region of each of the PMOS transistors in the core CMOS circuits is greater than the average dopant concentration of the channel region of each of the PMOS transistors in the I/O CMOS circuits.

In addition, the donor-type impurity atoms are also implanted through the first and second n-well masks so that the dopant profile of the below-the-channel region of each of the PMOS transistors in the core CMOS circuits is substantially different than the dopant profile of the below-the-channel region of each of the PMOS transistors in the I/O CMOS circuits. Otherwise, in the second approach, the NMOS transistors in the core and the I/O CMOS circuits are formed at the same time, while the PMOS transistors in the core and the I/O CMOS circuits are also formed at the same time.

In a third approach to forming a dual gate structure, in addition to using a mask to form the gate dielectrics with two different thicknesses as in the first approach, a pair of n-extension masks is used to form the n-type source and drain extension regions of the NMOS transistors, counter dope the channel regions of the NMOS transistors in the I/O CMOS circuits, and optionally form any p-type halo or pocket regions.

The first n-extension mask of the pair exposes the gates and the p-type wells of the NMOS transistors in the core CMOS circuit, while the second n-extension mask of the pair exposes the gates and the p-type wells of the NMOS transistors in the I/O CMOS circuits. When the first n-extension mask is in place, donor-type impurity atoms are implanted into the p-type wells of the NMOS transistors in the core CMOS circuits. The implant forms spaced-apart n-type source and drain extension regions in each p-type well of the NMOS transistors of the core CMOS circuits. The donor-type impurity atoms are blocked from the p-type channel regions by the gates.

While the first n-extension mask remains in place, acceptor-type impurity atoms can be optionally implanted into the p-type wells of the NMOS transistors in the core CMOS circuits at a number of angles. The implant forms spaced-apart p-type halo or pocket regions in each p-type well of the NMOS transistors in the core CMOS circuits. The p-type halo or pocket regions in a p-type well touch the n-type source and drain extension regions and the p-type channel region that are in the p-type well. The implant energy is insufficient to penetrate through the gates into the channel regions.

After the first n-extension mask has been removed and the second n-extension mask has been put in place, donor-type impurity atoms are implanted into the p-type wells of the NMOS transistors in the I/O CMOS circuits. The implant forms spaced-apart n-type source and drain extension regions in each p-type well of the NMOS transistors in the I/O CMOS circuits. The donor-type impurity atoms are blocked from the p-type channel region by the gate.

While the second n-extension mask is still in place, donor-type impurity atoms are again implanted into the p-type wells of the NMOS transistors in the I/O CMOS circuits. This time, however, the donor-type impurity atoms are implanted with an implant energy that is sufficient to penetrate through the gates into the channel regions and counter dope the channel regions.

The introduction of donor-type impurity atoms into a channel region having only acceptor-type impurity atoms has the net effect of reducing the average dopant concentration of the acceptor-type impurity atoms in the channel region. In a counter doped channel region, the channel region has both acceptor-type and donor-type impurity atoms.

While the second n-extension mask of the pair remains in place, acceptor-type impurity atoms can be optionally implanted into the p-type wells of the NMOS transistors in the I/O CMOS circuits at a number of angles. The implant forms spaced-apart p-type halo or pocket regions in each p-type well of the NMOS transistors in the I/O CMOS circuits. The implant energy is insufficient to penetrate through the gates into the channel regions.

Further, a pair of p-extension masks is used to form the p-type source and drain extension regions of the PMOS transistors, counter dope the channel regions of the PMOS transistors in the I/O CMOS circuits, and optionally form any n-type halo or pocket regions. The first p-extension mask of the pair exposes the gates and the n-type wells of the PMOS transistors in the core CMOS circuit, while the second p-extension mask of the pair exposes the gates and the n-type wells of the PMOS transistors in the I/O CMOS circuits.

When the first p-extension mask is in place, acceptor-type impurity atoms are implanted into the n-type wells of the PMOS transistors of the core CMOS circuits. The implant forms spaced-apart p-type source and drain extension regions in each n-type well of the PMOS transistors in the core CMOS circuits. The acceptor-type impurity atoms are blocked from the n-type channel regions by the gates.

While the first p-extension mask remains in place, donor-type impurity atoms can be optionally implanted into the n-type wells of the PMOS transistors of the core CMOS circuits at a number of angles. The implant forms spaced-apart n-type halo or pocket regions in each n-type well of the PMOS transistors in the core CMOS circuits. The n-type halo or pocket regions in an n-type well touch the p-type source and drain extension regions and the n-type channel region that are in the n-type well. The implant energy is insufficient to penetrate through the gates into the channel regions.

After the first p-extension mask has been removed and the second p-extension mask has been put in place, acceptor-type impurity atoms are implanted into the n-type wells of the PMOS transistors of the I/O CMOS circuits. The implant forms spaced-apart p-type source and drain extension regions in each n-type well of the PMOS transistors in the I/O CMOS circuits. The acceptor-type impurity atoms are blocked from the n-type channel region by the gate.

While the second p-extension mask is still in place, acceptor-type impurity atoms are again implanted into the n-type wells of the PMOS transistors of the I/O CMOS circuits. This time, however, the acceptor-type impurity atoms are implanted with an implant energy that is sufficient to penetrate through the gates into the channel regions and counter dope the channel regions. The introduction of acceptor-type impurity atoms into a channel region having substantially only donor-type impurity atoms has the net effect of reducing the average dopant concentration of the donor-type impurity atoms in the channel region.

While the second p-extension mask of the pair remains in place, donor-type impurity atoms can be optionally implanted into the n-type wells of the PMOS transistors of the I/O CMOS circuits at a number of angles. The implant forms spaced-apart n-type halo or pocket regions in each n-type well of the PMOS transistors of the I/O CMOS circuits. The implant energy is insufficient to penetrate through the gates into the channel regions.

Otherwise, in the third approach, the NMOS transistors in the core and I/O CMOS circuits are formed at the same time, while the PMOS transistors in the core and I/O CMOS circuits are also formed at the same time. Although there are three common methods of forming a CMOS structure with dual gate dielectrics, there is a need for other low-cost methods of forming a CMOS structure with dual gate dielectrics.

SUMMARY OF THE INVENTION

The present invention provides a dual gate dielectric semiconductor structure. The semiconductor structure of the present invention includes a semiconductor region and a first body region that touches the semiconductor region. The first body region has a first channel region and a below-the-first channel region that touches and lies below the first channel region. The first channel region has a first middle point. The first channel region at the first middle point includes a first type of impurity atoms, is substantially free of a second type of impurity atoms, and has an average dopant concentration. The below-the-first channel region has a dopant profile. The semiconductor structure also includes a first source region and a first drain region. The first source region touches the first body region, and includes substantially more of the second type of impurity atoms than the first type of impurity atoms. The first drain region touches the first body region, is spaced apart from the first source region, and includes substantially more of the second type of impurity atoms than the first type of impurity atoms. The first middle point lies midway between the first source and drain regions. The semiconductor structure additionally includes a second body region that touches the semiconductor region and lies spaced apart from the first body region. The second body region has a second channel region and a below-the-second channel region that touches and lies below the second channel region. The second channel region has a second middle point. The second channel region at the second middle point includes the first type of impurity atoms, is substantially free of the second type of impurity atoms, and has an average dopant concentration that is less than the average dopant concentration of the first channel region at the first middle point. The below-the-second channel region has a dopant profile that is substantially identical to the dopant profile of the below-the-first channel region. The semiconductor structure further includes a second source region and a second drain region. The second source region touches the second body region, and includes substantially more of the second type of impurity atoms than the first type of impurity atoms. The second drain region touches the second body region. The second drain region is spaced apart from the second source region and includes substantially more of the second type of impurity atoms than the first type of impurity atoms. The second middle point lies mid-way between the second source and second regions.

The present invention also includes a method of forming a dual gate semiconductor structure. The method includes forming a first mask that exposes a first well and a first gate to a first implant, and protects a second well and a second gate from the first implant. The first well and the second well are formed in a semiconductor substrate. A thin gate dielectric touches and lies between the first well and the first gate. A thick gate dielectric touches and lies between the second well and the second gate. The first and second wells include a first type of impurity atoms, are substantially free of a second type of impurity atoms, and have substantially identical dopant profiles when the first mask is formed. The method also includes implanting the second type of impurity atoms through the first mask into the first well to form a first source extension region and a first drain extension region that lies spaced apart from the first source extension region. The first well includes a first channel region that lies between the first source extension region and the first drain extension region. The first channel region has a first middle point that lies mid-way between the first source extension region and the first drain extension region. The first channel region at the first middle point includes the first type of impurity atoms, is substantially free of the second type of impurity atoms, and has an average dopant concentration. The method additionally includes implanting the first type of impurity atoms through the first mask, the first gate, and the thin gate dielectric into the first channel region to raise the average dopant concentration of the first channel region.

The present invention also includes a method of forming a dual gate semiconductor structure that reduces the fabrication costs. The method includes implanting a first type of impurity atoms into a substrate to simultaneously form a first core well, a first I/O source extension region, a first I/O drain extension region, and a first I/O well. The method also includes implanting a second type of impurity atoms into the substrate to simultaneously form a second core well, a second I/O well, a second I/O source extension region, and a second I/O drain extension region. The second I/O well touches the first I/O source extension region and the first I/O drain extension region. The second I/O source extension region and the second I/O drain extension region touch the first I/O well. The method additionally includes implanting the first type of impurity atoms into the second core well to simultaneously form a first core source extension region and a first core drain extension region, and implanting the second type of impurity atoms into the first core well to simultaneously form a second core source extension region and a second core drain extension region. Further, the method includes simultaneously implanting the first type of impurity atoms into the first core source extension region to form a first core main source region that touches the first core source extension region, the first core drain extension region to form a first core main drain region that touches the first core drain extension region, the first I/O source extension region to form a first I/O main source region that touches the first I/O source extension region, and the first I/O drain extension region to form a first I/O main drain region that touches the first I/O drain extension region.

A better understanding of the features and advantages of the present invention will be obtained by reference to the following detailed description and accompanying drawings which set forth an illustrative embodiment in which the principals of the invention are utilized.

BRIEF DESCRIPTION OF THE DRAWINGS

FIG. 2A is a flow chart of method 200. FIGS. 2B-2L are cross-sectional views of method 200.

FIGS. 4A-4I illustrate an example of a method 400 of forming a dual gate dielectric CMOS structure in accordance with an alternate embodiment of the present invention. FIG. 4A is a flow chart of method 400. FIGS. 4B-4I are cross-sectional views of method 400.

DETAILED DESCRIPTION OF THE INVENTION

Figure 1:
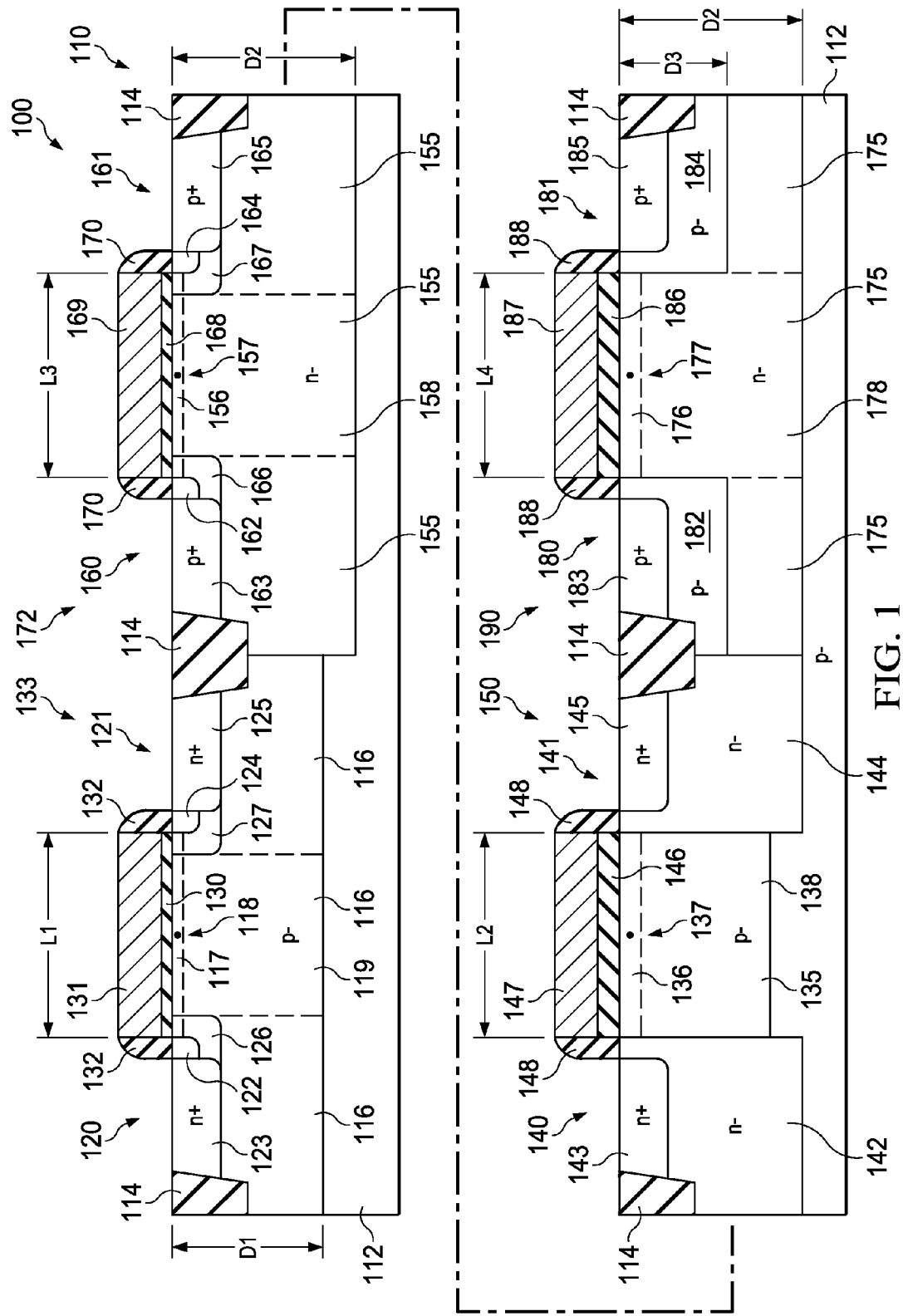
FIG. 1 is a cross-sectional view illustrating an example of a dual gate dielectric CMOS structure 100 in accordance with the present invention.

FIG. 1 shows a cross-sectional view that illustrates an example of a dual gate dielectric CMOS structure 100 in accordance with the present invention. As described in greater detail below, impurity atoms of a single type are implanted through a gate and a thin gate dielectric into a channel region that has substantially only the same type of impurity atoms at a middle point of the channel region. The implant increases the average dopant concentration of the single type of impurity atoms in the channel region to adjust the threshold voltage of a thin gate dielectric transistor.

As shown in FIG. 1, CMOS structure 100 includes a base structure 110. Base structure 110, in turn, includes a p-type single-crystal-silicon substrate 112 and a trench isolation structure 114. Base structure 110 also includes a p-type body region 116 that touches substrate 112 and trench isolation structure 114. Body region 116 has a higher average dopant concentration than substrate 112.

P-type body region 116, in turn, includes a p-type channel region 117, a middle point 118 of channel region 117, and a p-type below-the-channel region 119 that touches and lies directly below p-type channel region 117. P-type channel region 117 at the middle point 118 is substantially free of donor-type impurity atoms. In addition, p-type channel region 117 has a channel length L1 and an average dopant concentration, while p-type below-the-channel region 119 has a dopant profile directly below middle point 118. A channel region is the surface portion of the body region that influences the threshold voltage of the transistor. A dopant profile can be graphically represented with a dopant concentration axis and a depth down from the top surface of the region axis.

Base structure 110 further includes an n-type source 120 and an n-type drain 121 that each touch p-type body region 116. The n-type source 120 and drain 121 are spaced apart. In addition, n-type source 120 includes an n-type source extension region 122 and an n-type main source region 123 that touches region 122.

Further, n-type drain 121 includes an n-type drain extension region 124 and an n-type main drain region 125 that touches region 124. Main source region 123 has a greater dopant concentration than extension region 122, while main drain region 125 has a greater dopant concentration than extension region 124. In addition, middle point 118 lies mid-way between source 120 and drain 121.

Base structure 110 also includes a p-type halo 126 that touches p-type body region 116 and n-type source 120, and a p-type halo 127 that touches p-type body region 116 and n-type drain 121. The p-type halos 126 and 127, which are spaced apart, have higher average dopant concentrations than the adjoining portions of below-the-channel region 119. (The halos 126 and 127 can optionally be omitted.)

In addition to base structure 110, CMOS structure 100 also includes a thin gate dielectric structure 130 that touches and lies above p-type channel region 117, and a conductive gate 131 that touches thin gate dielectric structure 130 and lies above p-type channel region 117 and thin gate dielectric structure 130. CMOS structure 100 further includes a sidewall spacer 132 that touches and laterally surrounds gate 131.

The combination of p-type body region 116, p-type channel region 117, p-type below-the-channel region 119, n-type source 120, n-type drain 121, p-type halo 126, p-type halo 127, thin gate dielectric structure 130, conductive gate 131, and sidewall spacer 132 define a thin gate dielectric (core) NMOS transistor 133.

As further shown in FIG. 1, base structure 110 also includes a p-type body region 135 that touches substrate 112. Body region 135 has a higher average dopant concentration than substrate 112. In addition, p-type body region 135, in turn, includes a p-type channel region 136, a middle point 137 of channel region 136, and a p-type below-the-channel region 138 that touches and lies directly below p-type channel region 136.

P-type channel region 136 at the middle point 137 is substantially free of donor-type impurity atoms. In addition, p-type channel region 136 has a channel length L2 that is substantially greater (e.g., 10X) than the channel length L1 of p-type channel region 117, and an average dopant concentration that is substantially less than the average dopant concentration of p-type channel region 117. In addition, p-type below-the-channel region 138 has a dopant profile directly below middle point 137 that is substantially identical to the dopant profile of p-type below-the-channel region 119 directly below middle point 118.

Base structure 110 further includes an n-type source 140 and an n-type drain 141 that each touch p-type body region 135. The n-type source 140 and drain 141 are spaced apart. In addition, n-type source 140 includes an n-type source extension region 142 and an n-type main source region 143 that touches region 142, while n-type drain 141 includes an n-type drain extension region 144 and an n-type main drain region 145 that touches region 144.

N-type main source region 143 touches n-type source extension region 142 so that only n-type source extension region 142 lies horizontally between p-type body region 135 and n-type main source region 143. N-type main drain region 145 touches n-type drain extension region 144 so that only n-type drain extension region 144 lies horizontally between p-type body region 135 and n-type main drain region 145. Main source region 143 has a greater dopant concentration than extension region 142, while main drain region 145 has a greater dopant concentration than extension region 144. Further, middle point 137 lies mid-way between source 140 and drain 141.

In addition, CMOS structure 100 includes a thick gate dielectric structure 146 that touches and lies above p-type channel region 136, and a conductive gate 147 that touches thick gate dielectric structure 146 and lies above p-type channel region 136 and thick gate dielectric structure 146. (Thick gate dielectric structure 146 is thicker than thin gate dielectric structure 130.) CMOS structure 100 also includes a sidewall spacer 148 that touches and laterally surrounds gate 147.

The combination of p-type body region 135, p-type channel region 136, p-type below-the-channel region 138, n-type source 140, n-type drain 141, thick gate dielectric structure 146, conductive gate 147, and sidewall spacer 148 define a thick gate dielectric (I/O) NMOS transistor 150.

As additionally shown in FIG. 1, base structure 110 includes an n-type body region 155 that touches substrate 112 and trench isolation structure 114. N-type body region 155, in turn, includes an n-type channel region 156, a middle point 157 of channel region 156, and an n-type below-the-channel region 158 that touches and lies directly below n-type channel region 156.

N-type channel region 156 at the middle point 157 is substantially free of acceptor-type impurity atoms. In addition, n-type channel region 156 has a channel length L3, and an average dopant concentration, while n-type below-the-channel region 158 has a dopant profile directly below middle point 157.

Base structure 110 further includes a p-type source 160 and a p-type drain 161 that each touch n-type body region 155. The p-type source 160 and drain 161 are spaced apart. In addition, p-type source 160 includes a p-type source extension region 162 and a p-type main source region 163 that touches region 162.

Further, p-type drain 161 includes a p-type drain extension region 164 and a p-type main drain region 165 that touches region 164. Main source region 163 has a greater dopant concentration than extension region 162, while main drain region 165 has a greater dopant concentration than extension region 164. In addition, middle point 157 lies mid-way between source 160 and drain 161.

Base structure 110 additionally includes an n-type halo 166 that touches n-type body region 155 and p-type source 160, and an n-type halo 167 that touches n-type body region 155 and p-type drain 161. The n-type halos 166 and 167, which are spaced apart, have higher average dopant concentrations than the adjoining portions of below-the-channel region 158. (The halos 166 and 167 can optionally be omitted.)

In addition, CMOS structure 100 includes a thin gate dielectric structure 168 that touches and lies above n-type channel region 156, and a conductive gate 169 that touches thin gate dielectric structure 168 and lies above n-type channel region 156 and thin gate dielectric structure 168. CMOS structure 100 also includes a sidewall spacer 170 that touches and laterally surrounds gate 169.

The combination of n-type body region 155, n-type channel region 156, n-type below-the-channel region 158, p-type source 160, p-type drain 161, n-type halo 166, n-type halo 167, thin gate dielectric structure 168, conductive gate 169, and sidewall spacer 170 define a thick gate dielectric (core) PMOS transistor 172.

As further shown in FIG. 1, base structure 110 also includes an n-type body region 175 that touches substrate 112. N-type body region 175, in turn, includes an n-type channel region 176, a middle point 177 of channel region 176, and an n-type below-the-channel region 178 that touches and lies directly below n-type channel region 176.

N-type channel region 176 at the middle point 177 is substantially free of acceptor-type of impurity atoms. In addition, n-type channel region 176 has a channel length L4 that is substantially greater (e.g., 10X) than the channel length L3 of n-type channel region 156, and an average dopant concentration that is substantially less than the average dopant concentration of n-type channel region 156. Further, n-type below-the-channel region 178 has a dopant profile directly below middle point 177 that is substantially identical to the dopant profile of n-type below-the-channel region 158 directly below middle point 157.

Base structure 110 also includes a p-type source 180 and a p-type drain 181 that each touch n-type body region 175. The p-type source 180 and drain 181 are spaced apart. In addition, p-type source 180 includes a p-type source extension region 182 and a p-type main source region 183 that touches region 182. Further, p-type drain 181 includes a p-type drain extension region 184 and a p-type main drain region 185 that touches region 184.

P-type main source region 183 touches p-type source extension region 182 so that only p-type source extension region 182 lies horizontally between n-type body region 175 and p-type main source region 183. P-type main drain region 185 touches p-type drain extension region 184 so that only p-type drain extension region 184 lies horizontally between n-type body region 175 and p-type main drain region 185.

The p-type source extension region 182 and the p-type drain extension region 184 are spaced apart from substrate 112. In addition, main source region 183 has a greater dopant concentration than extension region 182, while main drain region 185 has a greater dopant concentration than extension region 184. Further, middle point 177 lies mid-way between source 180 and drain 181.

In addition, CMOS structure 100 includes a thick gate dielectric structure 186 that touches and lies above n-type channel region 176, and a conductive gate 187 that touches thick gate dielectric structure 186 and lies above n-type channel region 178 and thick gate dielectric structure 186. (Thick gate dielectric structure 186 is thicker than thin gate dielectric structure 168.) CMOS structure 100 also includes a sidewall spacer 188 that touches and laterally surrounds gate 187.

The combination of n-type body region 175, n-type channel region 176, n-type below-the-channel region 178, p-type source 180, p-type drain 181, thick gate dielectric structure 186, conductive gate 187, and sidewall spacer 188 define a thick gate dielectric (I/O) PMOS transistor 190. Thus, dual gate dielectric CMOS structure 100 includes the NMOS transistors 133 and 150 and the PMOS transistors 172 and 190.

In the present example, the p-type body regions 116 and 135 each has a maximum depth D1 that is less than a maximum depth D2 of each of the n-type body regions 155 and 175 and each of the n-type extension regions 142 and 144. (Alternately, the p-type body regions 116 and 135 can each have a maximum depth that is greater than the maximum depth of each of the n-type body regions 155 and 175 and each of the n-type extension regions 142 and 144.)

Further, the p-type extension regions 182 and 184 each has a maximum depth D3 that is less than the maximum depth D1 of each of the p-type body regions 116 and 135. In addition, the p-type body regions 116 and 135 are spaced apart from each other, while the n-type body regions 155 and 175 are spaced apart from each other.

With respect to core NMOS transistor 133, when a positive drain-to-source voltage $V_{DS}$ is present, and the gate-to-source voltage $V_{GS}$ is more positive than the threshold voltage, NMOS transistor 133 turns on and electrons flow from source region 120 to drain region 121. When the gate-to-source voltage $V_{GS}$ is more negative than the threshold voltage, core NMOS transistor 133 turns off and no electrons (other than a very small leakage current) flow from source region 120 to drain region 121.

Similarly, with respect to I/O NMOS transistor 150, when a positive drain-to-source voltage $V_{DS}$ is present, and the gate-to-source voltage $V_{GS}$ is more positive than the threshold voltage, NMOS transistor 150 turns on and electrons flow from source region 140 to drain region 141. When the gate-to-source voltage $V_{GS}$ is more negative than the threshold voltage, I/O NMOS transistor 150 turns off and no electrons (other than a very small leakage current) flow from source region 140 to drain region 142. The threshold voltage of NMOS transistor 133 is less than the threshold voltage of NMOS transistor 150.

With respect to core PMOS transistor 172, when a negative drain-to-source voltage $V_{DS}$ is present, and the gate-to-source voltage $V_{GS}$ is more negative than the threshold voltage, PMOS transistor 172 turns on and holes flow from source region 160 to drain region 161. When the gate-to-source voltage $V_{GS}$ is more positive than the threshold voltage, PMOS transistor 172 turns off and no holes (other than a very small leakage current) flow from source region 160 to drain region 161.

Similarly, with respect to I/O PMOS transistor 190, when a negative drain-to-source voltage $V_{DS}$ is present, and the gate-to-source voltage $V_{GS}$ is more negative than the threshold voltage, PMOS transistor 190 turns on and holes flow from source region 180 to drain region 181. When the gate-to-source voltage $V_{GS}$ is more positive than the threshold voltage, PMOS transistor 190 turns off and no holes (other than a very small leakage current) flow from source region 180 to drain region 181.

In addition, the core NMOS and PMOS transistors 133 and 172 can utilize a power supply voltage of 1.2V, while the I/O NMOS and PMOS transistors 150 and 190 can utilize a power supply voltage of 1.5V. The NMOS transistors 133 and 150 and the PMOS transistors 172 and 190 can also operate with other power supply voltages as well. For example, the core NMOS and PMOS transistors 133 and 172 can utilize a power supply voltage of 3.3V, while the I/O NMOS and PMOS transistors 150 and 190 can utilize a power supply voltage of 5.0V. (The halos 126, 127, 166, and 167 can be omitted in higher-voltage applications.)

Figure 2A:
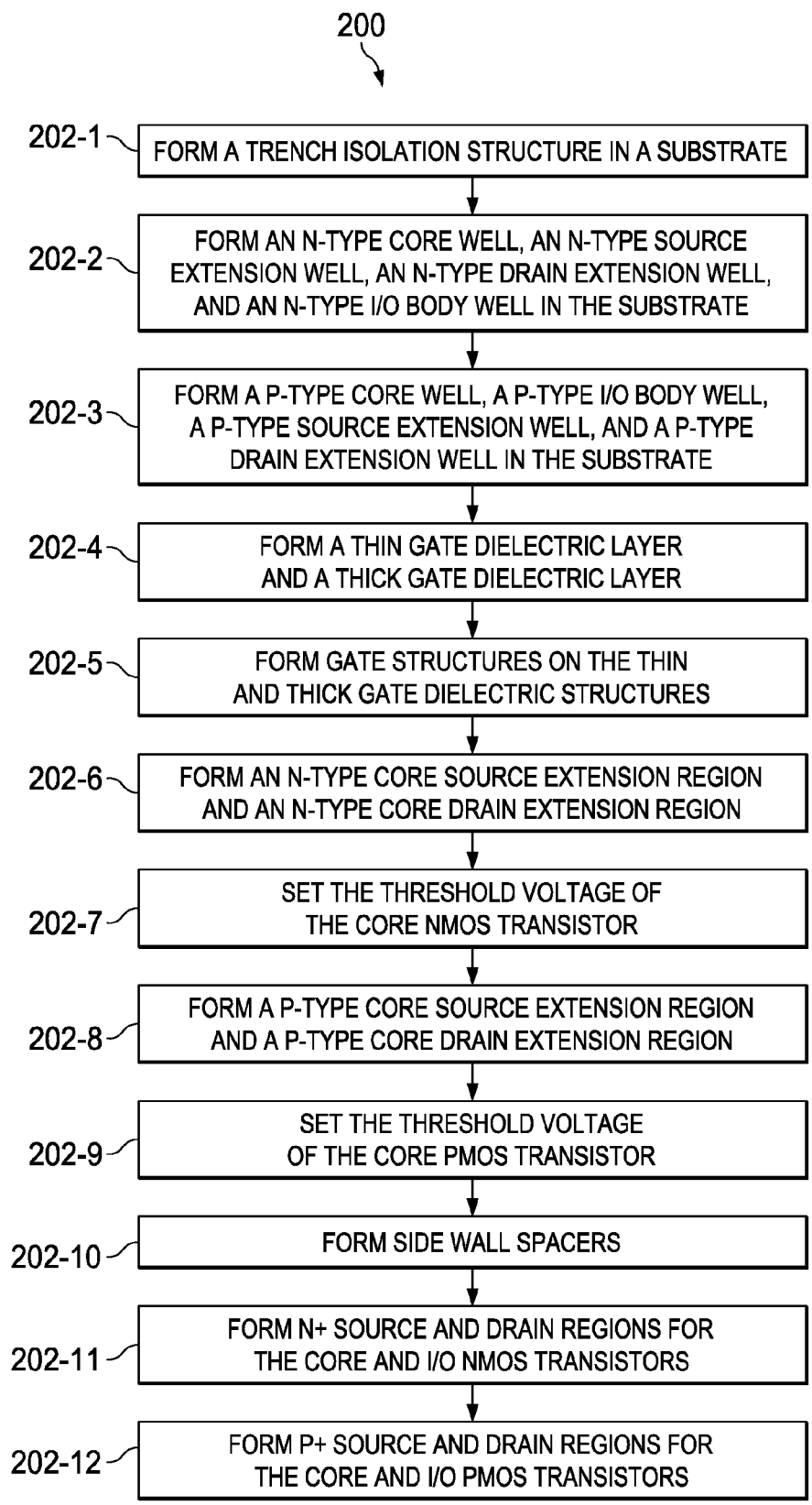
FIGS. 2A-2L illustrate an example of a method 200 of forming a dual gate dielectric CMOS structure in accordance with the present invention.

FIGS. 2A-2L illustrate an example of a method 200 of forming a dual gate dielectric CMOS structure in accordance with the present invention. FIG. 2A shows a flow chart of method 200, while FIGS. 2B-2L show cross-sectional views of method 200. In the present example, method 200 forms the NMOS and PMOS transistors of a core CMOS circuit and the NMOS and PMOS transistors of an I/O CMOS circuit.

As shown in FIG. 2A, method 200 begins at step 202-1 by forming a trench isolation structure in a conventionally-formed substrate (e.g., single-crystal silicon with a p-type conductivity and a resistance of 2-12 ohm-cm). For example, a trench isolation structure can be formed by first depositing an isolation stack (e.g., 100 Å of SiO$_2$ followed by 2000 Å of Si$_3$N$_4$) on the substrate, followed by selectively etching a trench through the isolation stack and into the substrate.

The trench can be selectively etched by first forming a patterned photoresist layer on the isolation stack in a conventional manner, which includes depositing a layer of photoresist, projecting a light through a patterned black/clear glass plate known as a mask to form a patterned image on the layer of photoresist, and removing the imaged photoresist regions, which were softened by exposure to the light.

Once the patterned photoresist layer has been formed, the exposed region of the isolation stack and underlying portion of the substrate are etched in a conventional fashion to form a trench approximately 3500 Å-5000 Å deep in the wafer. The patterned photoresist layer is then removed using standard processes, such as an ash process.

Following this, an isolation material (e.g., one or more different oxides) is deposited on the isolation stack to fill up the trench. After the trench has been filled, the isolation material is planarized (e.g., using chemical-mechanical polishing), stopping on the top surface of the isolation stack (e.g., the top surface of the Si$_3$N$_4$), to form a trench isolation structure that extends into the substrate.

Figure 2B:
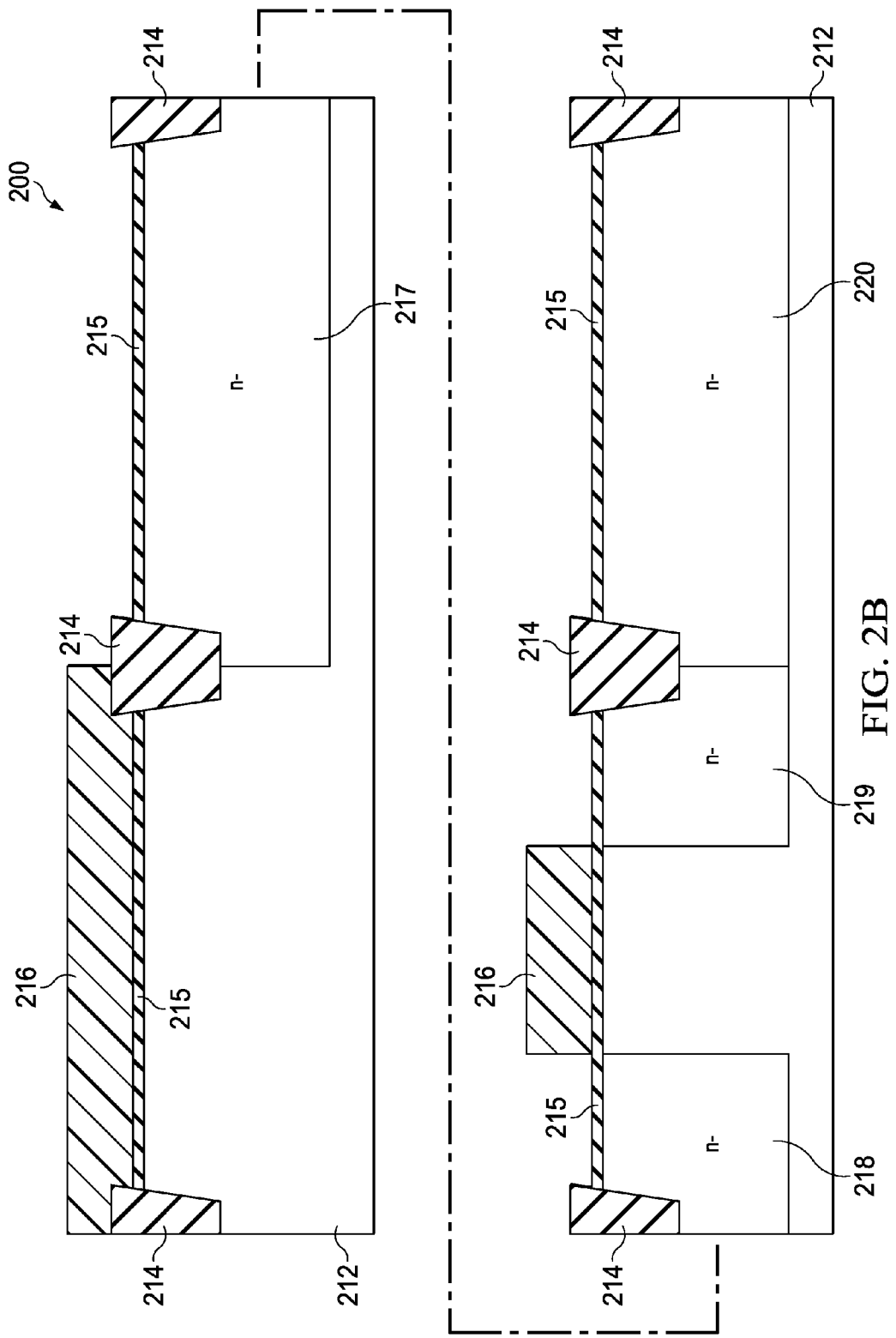

Next, all or a portion of the isolation stack is removed. In the present example, a portion of the isolation stack is removed (e.g., the top Si$_3$N$_4$ layer of the isolation stack can be removed with hot H$_3$PO$_4$), leaving a remaining isolation stack. FIG. 2B shows method 200 after a portion of the isolation stack has been removed, and includes a p-type substrate 212, a trench isolation structure 214 that touches substrate 212, and a remaining isolation stack 215.

As shown in FIG. 2A, after all or a portion of the isolation stack has been removed, method 200 next moves to step 202-2 to form an n-type core well, an n-type source extension well, an n-type drain extension well, and an n-type I/O body well in the substrate. As shown in FIG. 2B, the n-type wells can be formed by first forming a patterned photoresist layer 216 in a conventional manner to touch and lie over remaining isolation stack 215.

After patterned photoresist layer 216 has been formed, donor-type (n-type) impurity atoms, such as phosphorous or arsenic, are implanted into p-type substrate 212 with multiple implant energies (chain implants) in a conventional manner. The n-type implant forms an n-type core well 217, an n-type source extension well 218, an n-type drain extension well 219, and an n-type I/O body well 220 that each touches p-type substrate 212.

As a result of being simultaneously formed, the n-type wells 217, 218, 219, and 220 each has substantially the same maximum depth and the same dopant profile. Further, the upper regions of the n-type wells 217, 218, 219, and 220 have the same average dopant concentration, which is selected for n-type well 220 to set the threshold voltage of a to-be-formed PMOS transistor for the I/O CMOS circuit. Following the implant, patterned photoresist layer 216 is removed in a conventional fashion.

Figure 2C:
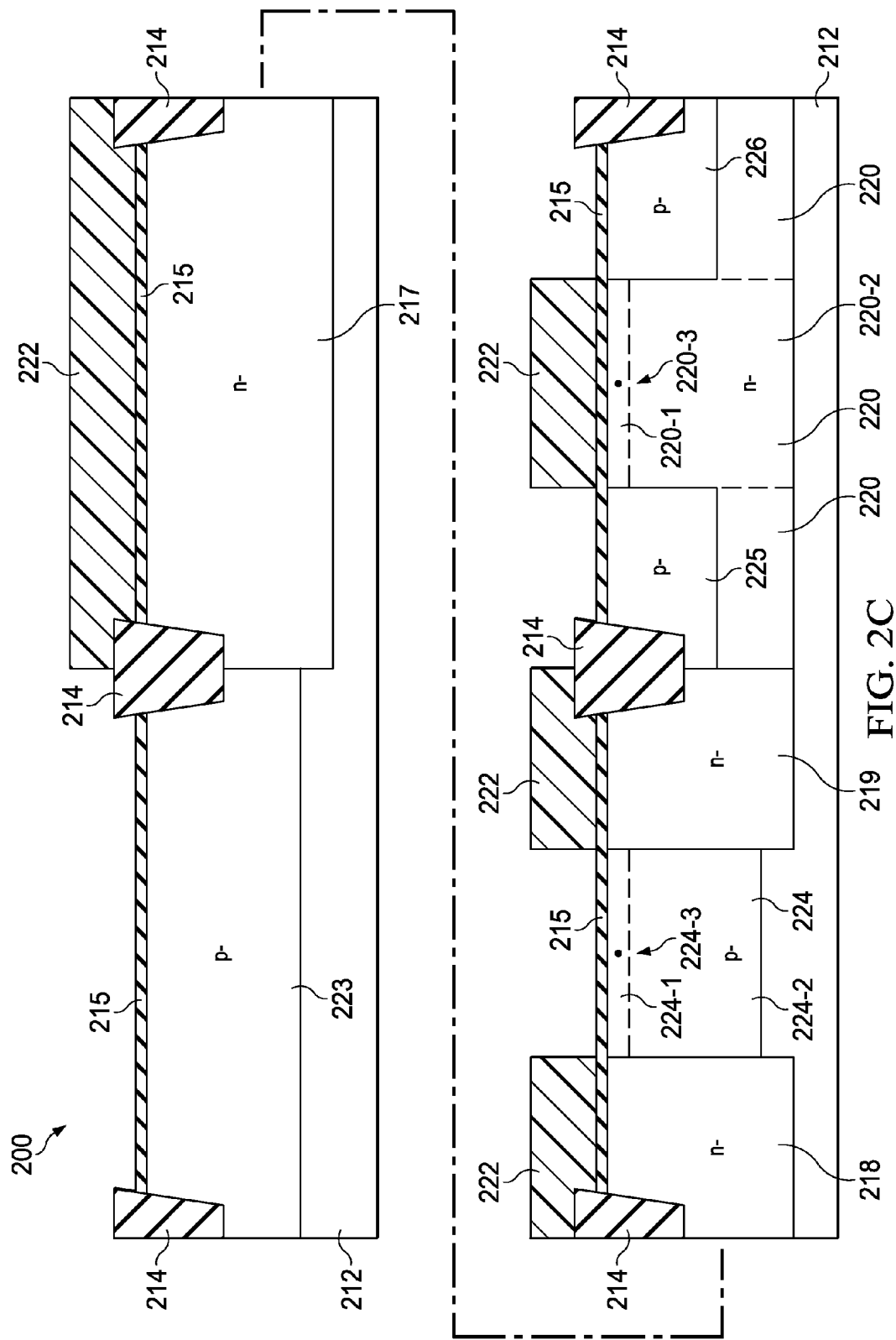

As shown in FIG. 2A, method 200 next moves to step 202-3 to form a p-type core well, a p-type I/O body well, a p-type source extension well, and a p-type drain extension well in the substrate. As shown in FIG. 2C, the p-type wells can be formed by first forming a patterned photoresist layer 222 in a conventional manner to touch and lie over remaining isolation stack 215, and cover the n-type wells 217, 218, 219, and 220.

After patterned photoresist layer 222 has been formed, acceptor-type (p-type) dopant atoms, such as boron, are implanted into p-type substrate 212 with multiple implant energies (chain implants) in a conventional fashion. The p-type implant forms a p-type core well 223 and a p-type I/O body well 224 that each touch p-type substrate 212.

The p-type implant also forms a p-type source extension well 225 and a p-type drain extension well 226 that each touch n-type I/O well 220 and lie spaced apart from p-type substrate 212. The doses of the p-type chain implants are selected so that the upper portion of n-type well 220 is converted into a net acceptor-type region to form the p-type source extension well 225 and drain extension well 226, while the lower portion of n-type well 220 remains a net donor-type region. (The dose of the deeper p-type implants can be set to form net acceptor-type regions below the net donor-type regions that lie below p-type source extension well 225 and p-type drain extension well 226 if required by p-type core well 223 and p-type I/O body well 224 as long as the net donor-type regions sufficiently isolate p-type source extension well 225 and p-type drain extension well 226.)

In the present example, the maximum depths of the p-type wells 223, 224, 225, and 226 are each less than the maximum depths of the n-type wells 217, 218, 219, and 220. (Alternately, the maximum depths of the p-type wells 223, 224, 225, and 226 can each be greater than the maximum depths of the n-type wells 217, 218, 219, and 220.)

As a result of being simultaneously formed, the p-type wells 223 and 224 each has substantially the same maximum depth and the same dopant profile. Although formed at the same time, the p-type wells 225 and 226 (the regions with net acceptor-type impurity atoms) have a shallower maximum depth than the p-type wells 223 and 224 because the p-type wells 225 and 226 are formed in n-type well 220. Further, the upper regions of the p-type wells 223 and 224 have the same average dopant concentration, which is selected for p-type well 224 to set the threshold voltage of a to-be-formed NMOS transistor for the I/O CMOS circuit. (The upper regions of the p-type wells 223, 224, 225, and 226 have the same average concentration of acceptor-type impurity atoms.)

Further, n-type well 220 includes an n-type channel region 220-1 that lies between the p-type wells 225 and 226, and an n-type below-the-channel region 220-2 that touches and lies below channel region 220-1. Channel region 220-1 has an average dopant concentration, while below-the-channel region 220-2 has a dopant profile. Channel region 220-1 also has a middle point 220-3 that lies mid-way between p-type well 225 and p-type well 226. A channel region is the surface portion of the well that influences the threshold voltage of the transistor.

In addition, p-type well 224 includes a p-type channel region 224-1 that lies between the n-type wells 218 and 219, and a p-type below-the-channel region 224-2 that touches and lies below channel region 224-1. Channel region 224-1 has an average dopant concentration, while below-the-channel region 224-2 has a dopant profile. Channel region 224-1 also has a middle point 224-3 that lies mid-way between n-type well 218 and n-type well 219.

Following the implant, patterned photoresist layer 222 is removed in a conventional fashion. After patterned photoresist layer 222 has been removed, the n-type wells 217, 218, 219, and 220, and the p-type wells 223, 224, 225, and 226 are driven in (e.g., annealed at 1100° C. in a neutral ambient such as N$_2$).

As shown in FIG. 2A, after the p-type core well, the p-type I/O body well, the p-type source extension well, and the p-type drain extension well have been formed, method 200 next moves to step 202-4 to form a thin gate dielectric layer on the n-type and p-type core wells, and a thick gate dielectric layer on the n-type source extension well, the p-type I/O body well, the n-type drain extension well, the p-type source extension well, the n-type I/O body well, and the p-type drain extension well.

Figure 2D:
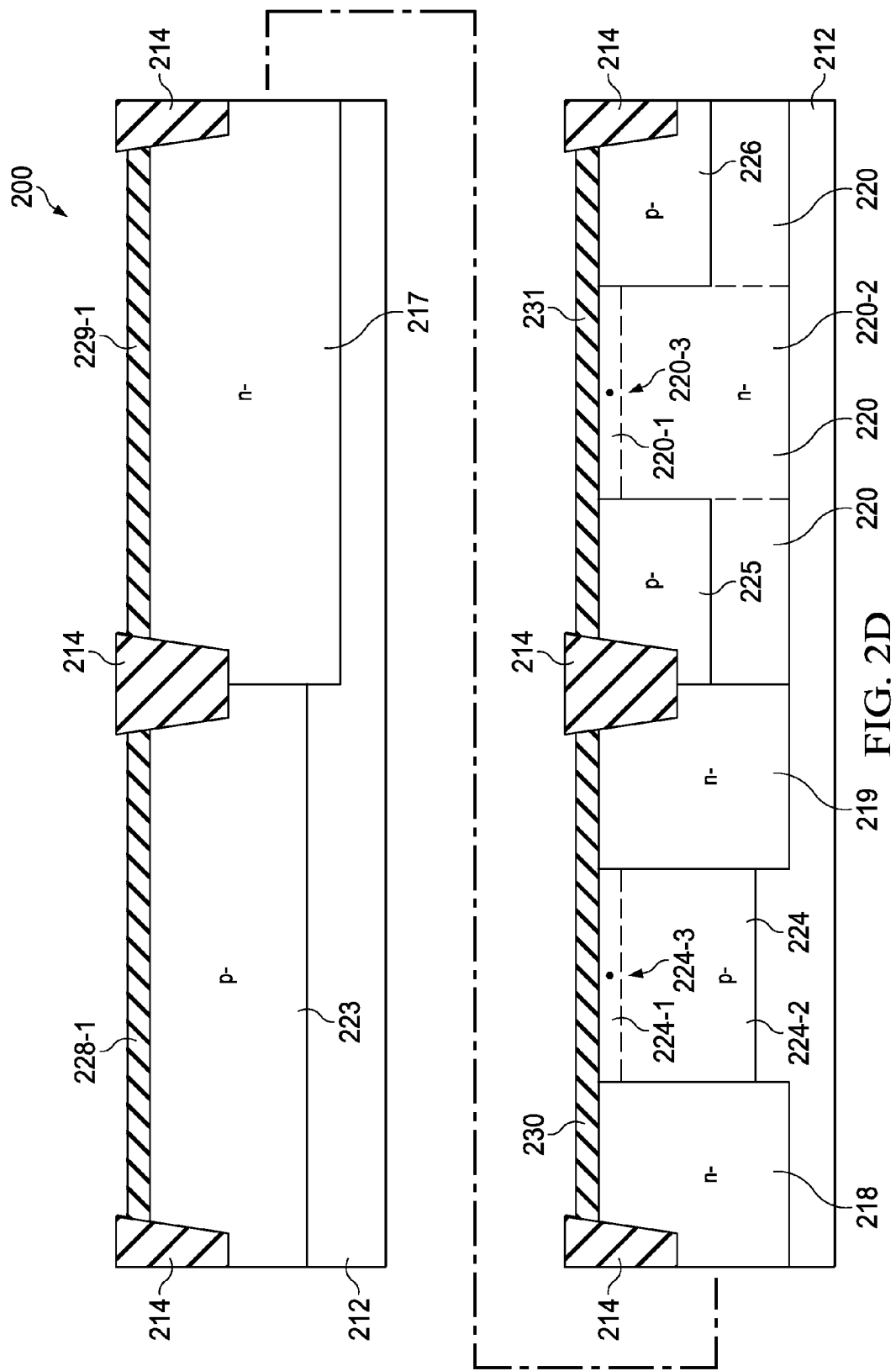

As shown in FIG. 2D, the thin and thick gate dielectric layers can be formed by first removing remaining isolation stack 215, followed by a conventional cleaning process to prepare the top surfaces of the wells 217, 218, 219, 220, 223, 224, 225, and 226 for thermal oxide growth. Following this, a gate dielectric structure 228-1 is grown on well 223, a gate dielectric structure 229-1 is grown on well 217, a gate dielectric structure 230 is grown on the wells 218, 219, and 224, and a gate dielectric structure 231 is grown on the wells 220, 225, and 226. The gate dielectric layers 228-1, 229-1, 230, and 231 are simultaneously formed. The growth continues until the thicknesses of the gate dielectric structures 228-1, 229-1, 230, and 231 reach the thickness required by the NMOS and PMOS transistors in the I/O CMOS circuits (e.g., 75 Å-200 Å).

Figure 2E:
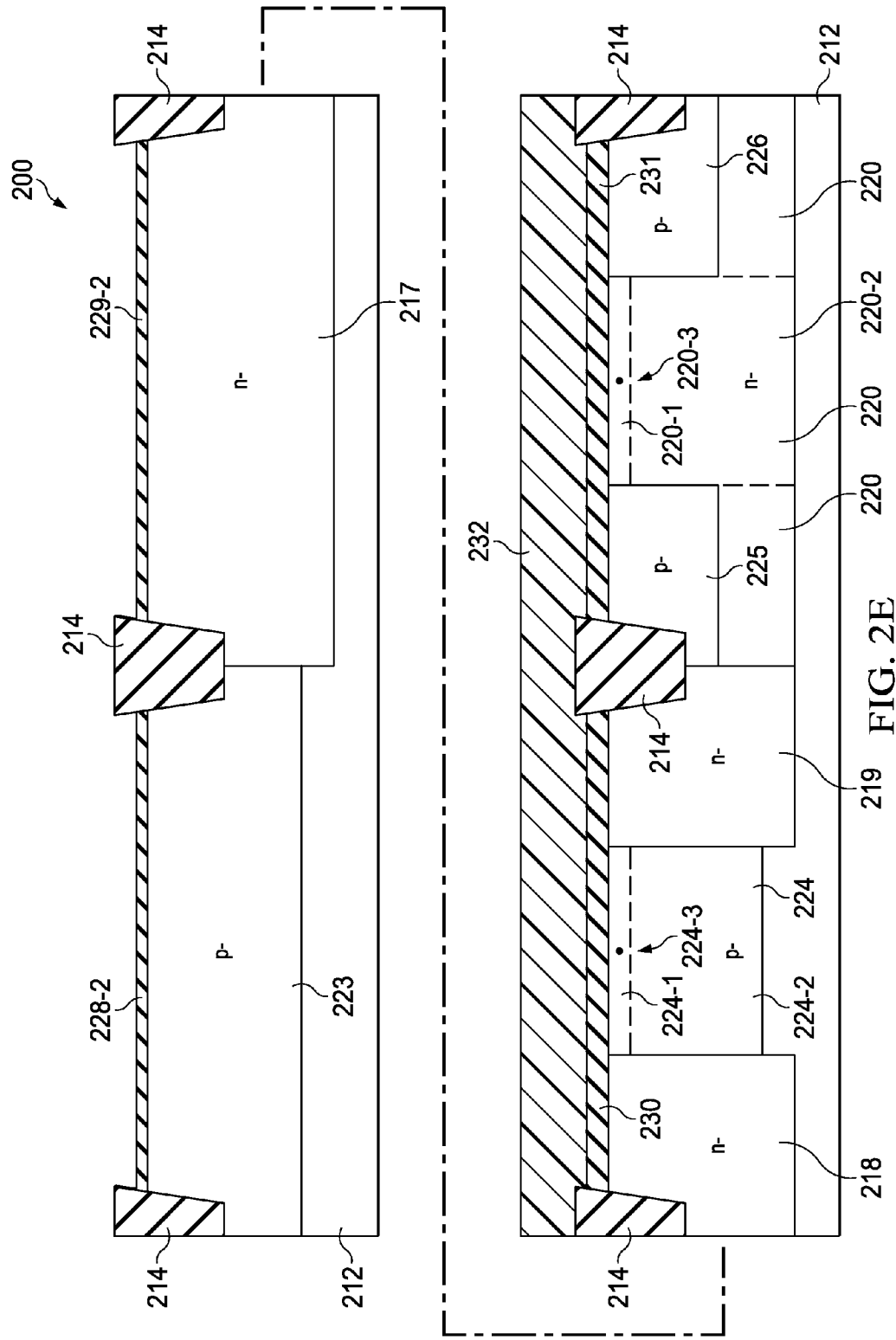

As shown in FIG. 2E, once the required thickness has been reached, the growth is stopped and a patterned photoresist layer 232 is formed in a conventional manner to touch and protect the gate dielectric structures 230 and 231. After patterned photoresist layer 232 has been formed, the gate dielectric structures 228-1 and 229-1 are removed to re-expose the top surfaces of the wells 217 and 223. Following this, a conventional cleaning process is used to prepare the top surfaces of the wells 217 and 223 for thermal oxide growth.

Next, a gate dielectric structure 228-2 is grown on well 223 and a gate dielectric structure 229-2 is grown on well 217 at the same time. The growth continues until the thicknesses of the gate dielectric structures 228-2 and 229-2 reach the thickness required by the NMOS and PMOS transistors in the core CMOS circuits (e.g., 15 Å-30 Å). Once the required thickness has been reached, the growth is stopped and patterned photoresist layer 232 is then removed in a conventional fashion.

Figure 2F:
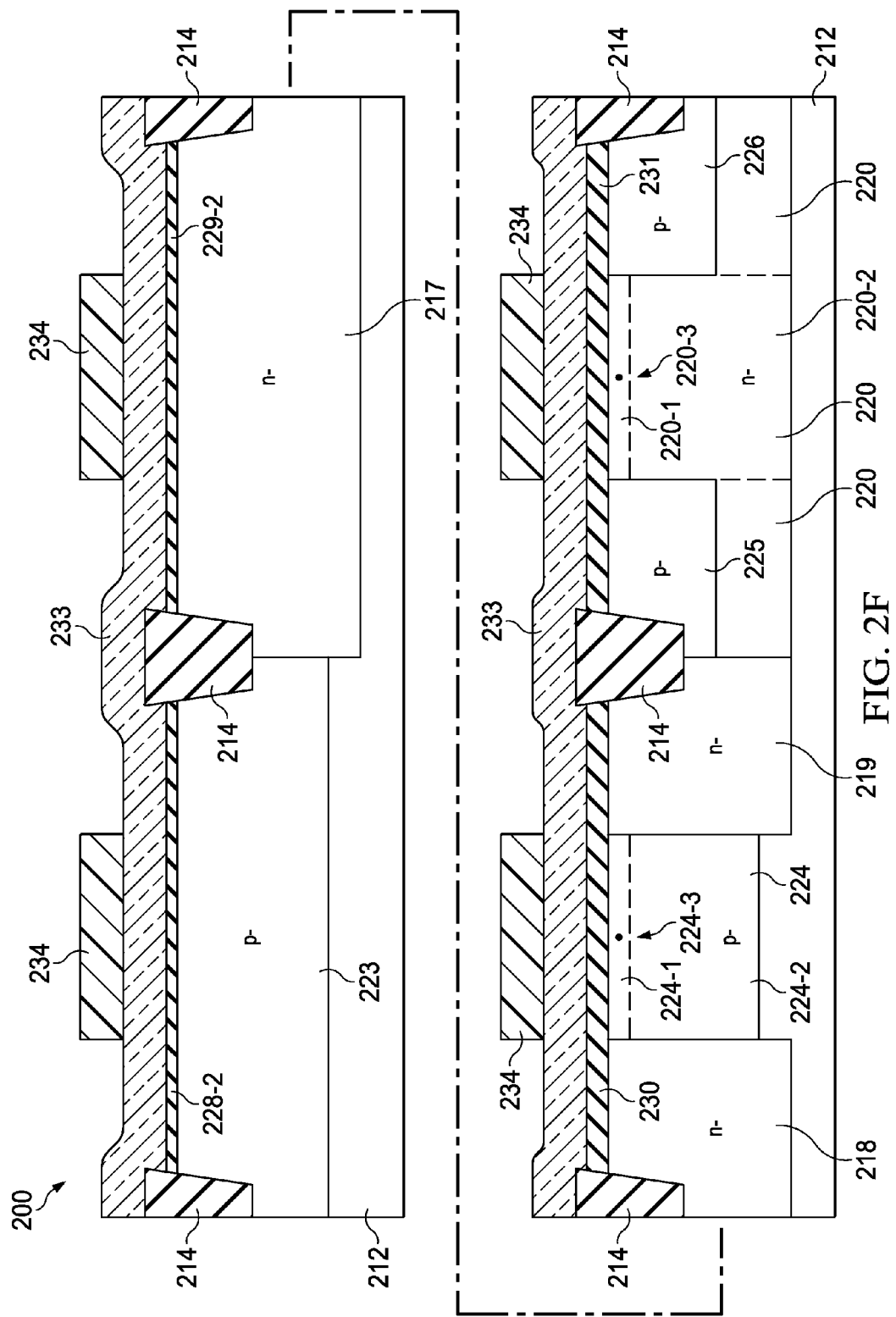

As shown in FIG. 2A, after the thin and thick gate dielectric structures have been formed, method 200 next moves to step 202-5 to form gate structures on the thin and thick gate dielectric structures. As shown in FIG. 2F, the gate structures can be formed by first depositing a polycrystalline silicon layer 233 approximately 1500 Å thick on the gate dielectric structures 228-2, 229-2, 230, and 231 in a conventional fashion. Following this, a patterned photoresist layer 234 is formed in a conventional manner to touch polycrystalline silicon layer 233.

Figure 2G:
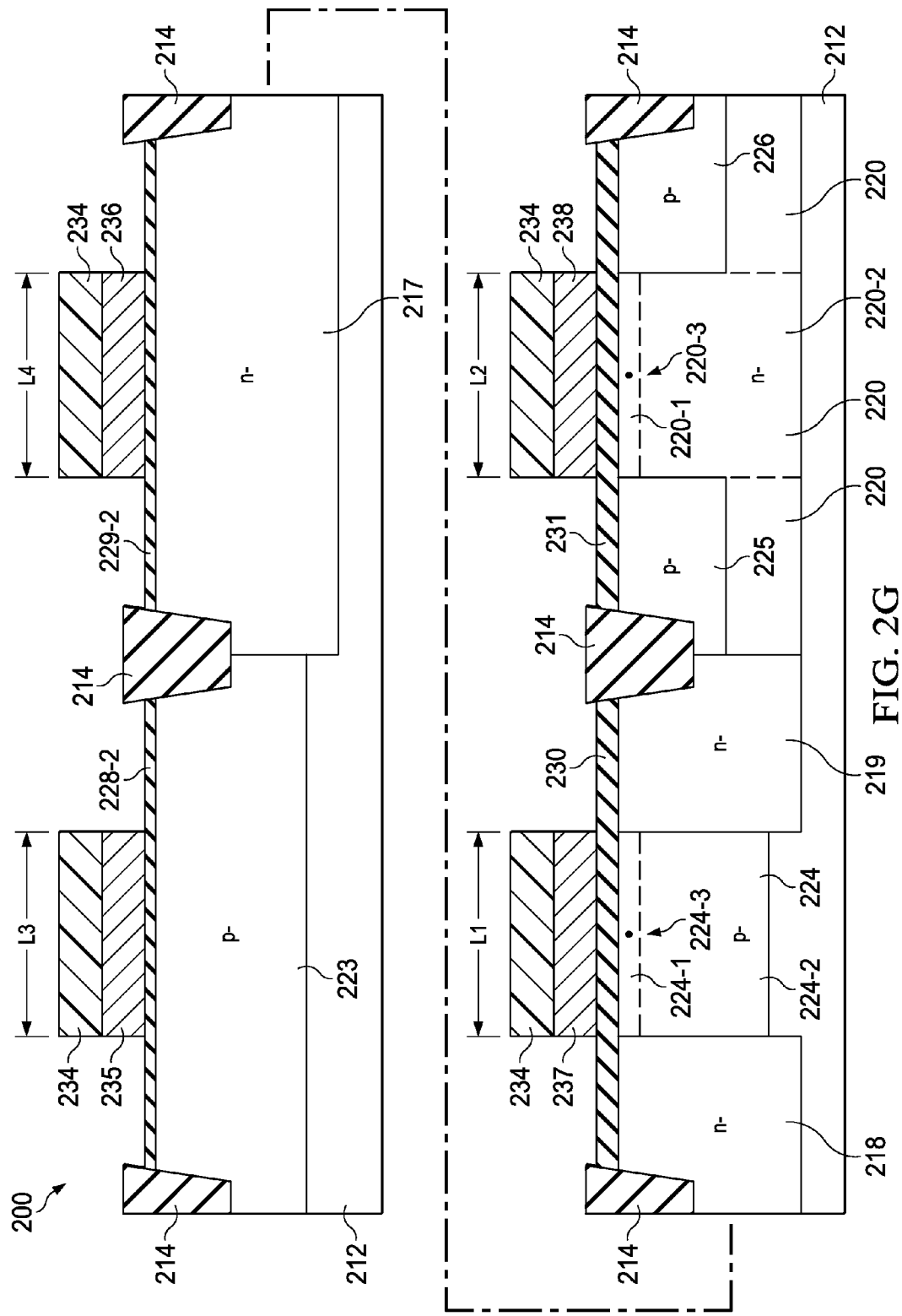

Next, as shown in FIG. 2G, the exposed regions of polycrystalline silicon layer 233 are etched in a conventional fashion to form a gate that touches gate dielectric structure 228, a gate that touches gate dielectric structure 229, a gate that touches gate dielectric structure 230, and a gate that touches gate dielectric structure 231. After the gate structures 235, 236, 237, and 238 have been formed, patterned photoresist layer 234 is removed in a conventional manner.

The exposed surfaces of the gates are then oxidized to form a gate structure 235 that touches gate dielectric structure 228, a gate structure 236 touches gate dielectric structure 229, a gate structure 237 touches gate dielectric structure 230, and a gate structure 238 that touches gate dielectric structure 231. The gate structures 237 and 238 are formed to have a length L1 and L2, respectively, which are longer (e.g., 10X) than the lengths L3 and L4 of the gate structures 235 and 236, respectively. At this point, a thin offset spacer can be optionally formed by depositing a thin non-conductive layer, and then anisotropically etching the thin non-conductive layer to form the offset spacer.

Figure 2H:
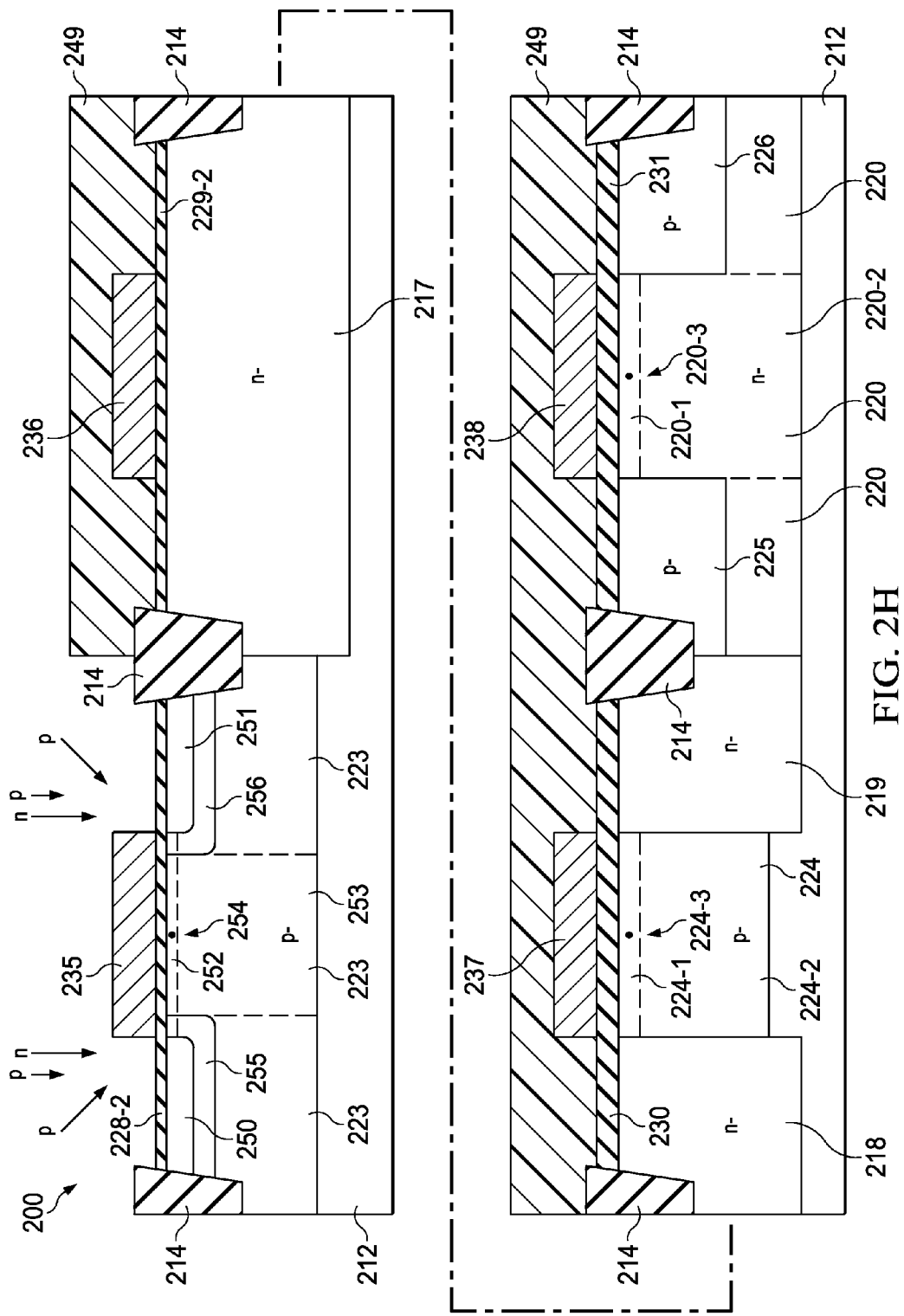

As shown in FIG. 2A, after the gate structures have been formed, method 200 next moves to step 202-6 to form a core n-type source extension region and a core n-type drain extension region. As shown in FIG. 2H, the core n-type source and drain extension regions can be formed by first forming a patterned photoresist layer 249 in a conventional manner. Patterned photoresist layer 249 touches the gate structures 236, 237, and 238, and overlies to protect the n-wells 217, 218, 219, and 220 and the p-wells 224, 225, and 226.

When patterned photoresist layer 249 is formed, the wells 223 and 224 include the acceptor-type impurity atoms. In addition, the wells 223 and 224 are substantially free of the donor-type impurity atoms, and have substantially identical dopant profiles. Further, the wells 217 and 220 include the donor-type impurity atoms. In addition, the wells 217 and 220 are substantially free of the acceptor-type impurity atoms, and have substantially identical dopant profiles.

After patterned photoresist layer 249 has been formed, donor-type (n-type) impurity atoms are implanted through an opening in patterned photoresist layer 249 into p-type well 223 in a conventional manner. The n-type implant forms an n-type source extension region 250 and an n-type drain extension region 251 in p-type well 223.

The implant also defines a p-type channel region 252 that lies between n-type source extension region 250 and an n-type drain extension region 251, and a p-type below-the-channel region 253 of p-type well 223 that touches and lies below p-type channel region 252. P-type channel region 252, in turn, has a middle point 254 that lies mid-way between the extension regions 250 and 251. P-type channel region 252 at middle point 254 includes the acceptor-type of impurity atoms. In addition, p-type channel region 252 at middle point 254 is substantially free of the donor-type of impurity atoms, and has an average dopant concentration.

As shown in FIG. 2A, after the n-type core source extension region and the n-type core n-type drain extension region have been formed, method 200 next moves to step 202-7 to set the threshold voltage of the core NMOS transistor. As shown in FIG. 2H, the threshold voltage of the core NMOS transistor can be set by implanting acceptor-type (p-type) dopant atoms through the opening in layer 249 into p-type well 223 in a conventional fashion to increase the average dopant concentration of p-type channel region 252.

The implant energy of the p-type implant is selected to penetrate through gate structure 235 into p-type well 223. The dose is selected (in combination with the dopant concentration of any to-be-formed p-type halos) to set the threshold voltage of a to-be-formed NMOS transistor for the core CMOS circuit by raising the concentration of acceptor-type impurity atoms in channel region 252.

Thus, due to the implantation of p-type dopant atoms, p-type channel region 252 has a higher average dopant concentration at middle point 254 than the average dopant concentration of channel region 224-1 at middle point 224-3. However, because the dopant profiles of the p-type wells 223 and 224 were initially the same, the dopant profiles of below-the-channel region 224-2 and below-the-channel region 253 remain substantially identical.

One of the advantages of the present invention is the p-type implant used to adjust the threshold voltage of the to-be-formed core NMOS transistor is additive, i.e., the p-type implant raises the concentration of p-type atoms that are present at the top surface of p-type well 223. This, in turn, leads to less variation in the threshold voltage when compared to the counter doping of one of the prior art approaches. Further, the p-type dopant is implanted through thin gate dielectric structure 228-2, which requires less implant energy and therefore results in less threshold voltage variation.

Next, as shown in FIG. 2H, the threshold voltage of the core NMOS transistor is further set by forming source and drain halos for the core NMOS transistor. The source and drain halos for the core NMOS transistor can be formed by again implanting acceptor-type impurity atoms through the opening in layer 249, this time at a number of angles to form a p-type halo 255 and a p-type halo 256 in p-type well 223. Gate structure 235 blocks the halo implants. As a result, the angled implants allow the halos 255 and 256, which have higher dopant concentrations than the adjoining portions of below-the-channel region 253, to extend under the ends of gate structure 235.

Another of the advantages of the present invention is the p-type implant used to adjust the threshold voltage of the to-be-formed core NMOS transistor reduces the dose required to form the halos 255 and 256, which results in better transistor performance. (The halos 255 and 256 can optionally be omitted.) After the p-type halos 255 and 256 have been formed, patterned photoresist layer 249 is removed in a conventional fashion. (The order that the impurity atoms are implanted can be reversed or otherwise altered.)

Figure 2I:
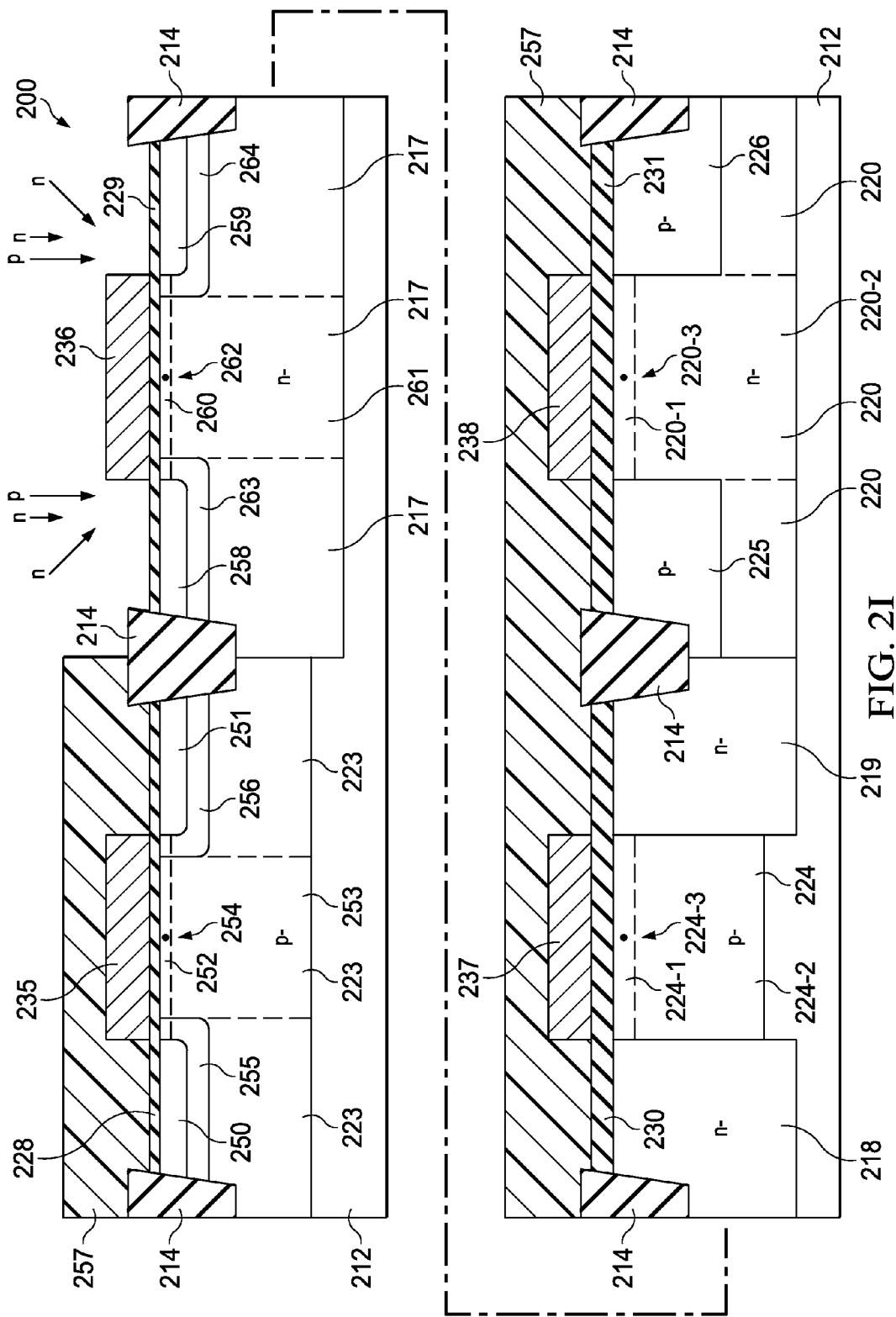

As shown in FIG. 2A, after the threshold voltage for core NMOS transistor has been set, method 200 next moves to step 202-8 to form a core p-type source extension region and a core p-type drain extension region. As shown in FIG. 2I, the core p-type source and drain regions can be formed by first forming a patterned photoresist layer 257 in a conventional manner. Patterned photoresist layer 257 touches the gate structures 235, 237, and 238, and overlies to protect the n-wells 218, 219, and 220 and the p-wells 223, 224, 225, and 226.

After patterned photoresist layer 257 has been formed, acceptor-type (p-type) impurity atoms are implanted through an opening in layer 257 into n-type well 217 in a conventional manner. The p-type implant forms a p-type source extension region 258 and a p-type drain extension region 259 in n-type well 217.

The implant also defines an n-type channel region 260 that lies between the p-type source and drain extension regions 258 and 259, and an n-type below-the-channel region 261 of n-type well 217 that touches and lies below n-type channel region 260. N-type channel region 260, in turn, has a middle point 262 that lies mid-way between the extension regions 258 and 259.

As shown in FIG. 2A, after the core p-type source extension region and the core p-type drain extension region have been formed, method 200 next moves to step 202-9 to set the threshold voltage of the core PMOS transistor. As shown in FIG. 2I, the threshold voltage of the core PMOS transistor can be set by implanting donor-type (n-type) impurity atoms through the opening in layer 257 into n-type well 217 in a conventional fashion to increase the average dopant concentration of n-type channel region 260.

The implant energy of the n-type implant is selected to penetrate through gate structure 236 into n-type well 217. The dose is selected (in combination with the dopant concentration of any to-be-formed n-type halos) to set the threshold voltage of a to-be-formed core PMOS transistor in n-type well 217 by raising the concentration of donor-type impurity atoms in channel region 260.

Thus, due to the implantation of n-type dopant atoms, n-type channel region 260 has a higher average dopant concentration at middle point 262 than the average dopant concentration of channel region 220-1 at middle point 220-3. However, because the dopant profiles of the n-type wells 217 and 220 were initially the same, the dopant profiles of below-the-channel region 220-2 and below-the-channel region 261 remain substantially identical.

One of the advantages of the present invention is the n-type implant used to adjust the threshold voltage of the to-be-formed core PMOS transistor is additive, i.e., the n-type implant raises the concentration of n-type atoms that are present in channel region 260. This, in turn, leads to less variation in the threshold voltage when compared to the counter doping of one of the prior art approaches. Further, the n-type dopant is implanted through thin gate dielectric structure 229, which requires less implant energy and therefore results in less threshold voltage variation.

Next, as shown in FIG. 2I, the threshold voltage of the core PMOS transistor is further set by forming source and drain halos for the core PMOS transistor. The source and drain halos for the core PMOS transistor can be formed by again implanting the donor-type impurity atoms through the opening in layer 257, this time at a number of angles to form an n-type halo 263 and an n-type halo 264 in n-type well 217. Gate structure 236 blocks the halo implants. As a result, the angled implants allow the halos 263 and 264, which have higher dopant concentrations than the adjoining portions of below-the-channel region 261, to extend under the ends of gate structure 236.

Another of the advantages of the present invention is the n-type implant used to adjust the threshold voltage of the to-be-formed core PMOS transistor reduces the dose required to form the halos 263 and 264, which results in better transistor performance. (The halos 263 and 264 can optionally be omitted.)

After the n-type halos 263 and 264 have been formed, patterned photoresist layer 257 is removed in a conventional fashion. (The order that the impurity atoms are implanted can be reversed or otherwise altered.) After patterned photoresist layer 257 has been removed, the extension regions 250, 251, 258, and 259, the halos 255, 256, 263, and 264, and the implants into channel regions 252 and 260 are driven in (e.g., annealed at 1100° C. in a neutral ambient such as $N_2$).

Figure 2J:
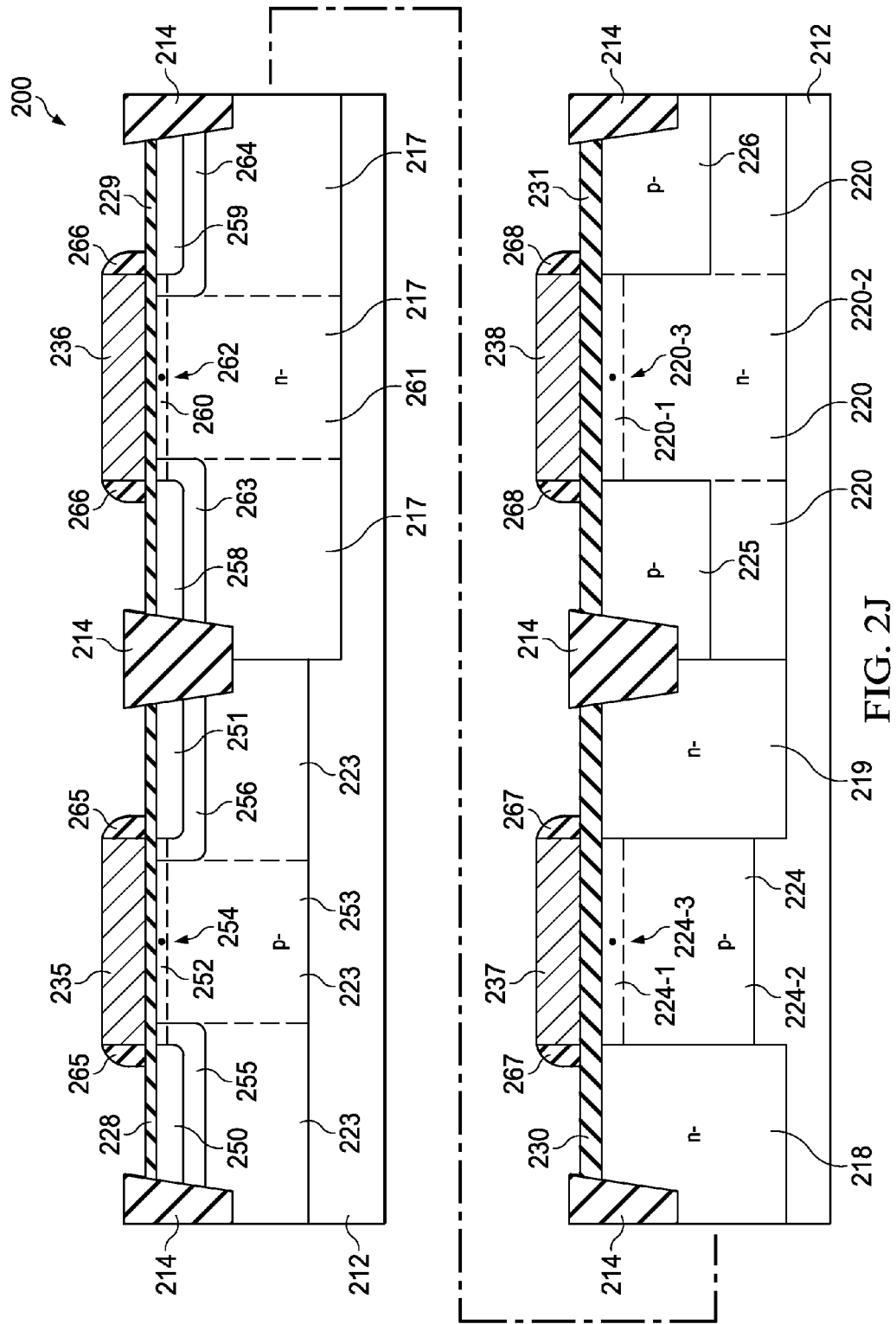

As shown in FIG. 2A, after the threshold voltage of the core PMOS transistor has been set, method 200 next moves to step 202-10 to form side wall spacers. As shown in FIG. 2J, the side wall spacers can be formed by depositing a non-conductive layer in a conventional manner to touch the gate dielectric structures 228, 229, 230, and 231, and the gate structures 235, 236, 237, and 238. The non-conductive layer can be implemented with, for example, an oxide layer.

Following this, the non-conductive layer is anisotropically etched to form a side wall spacer 265 that laterally surrounds gate structure 235, a side wall spacer 266 that laterally surrounds gate structure 236, a side wall spacer 267 that laterally surrounds gate structure 237, and a side wall spacer 268 that laterally surrounds gate structure 238.

Figure 2K:
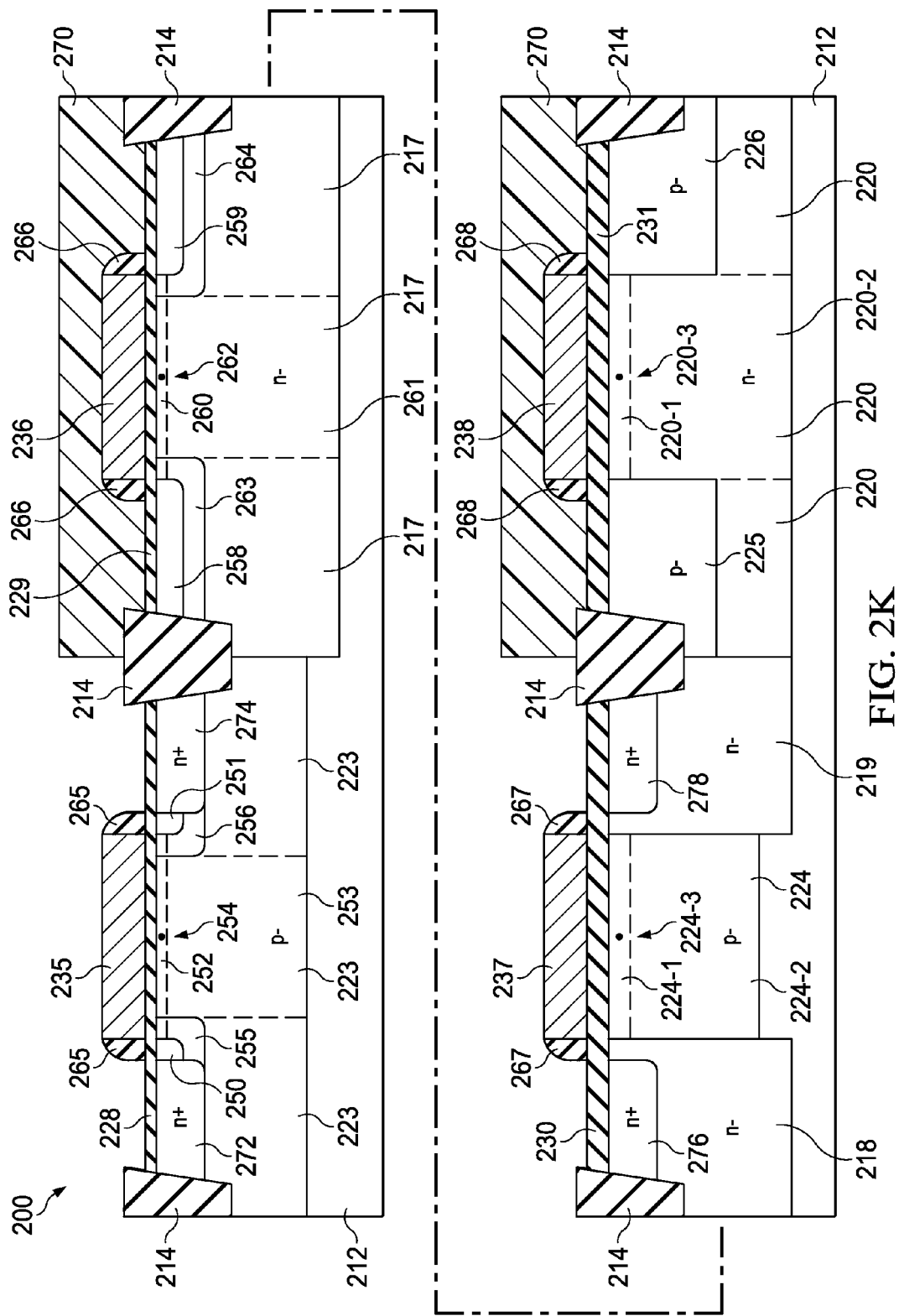

As shown in FIG. 2A, after the side wall spacers have been formed, method 200 next moves to step 202-11 to form n+ source and drain regions for the core and I/O NMOS transistors. As shown in FIG. 2K, the n+ source and drain regions for the core and I/O NMOS transistors can be formed by first forming a patterned photoresist layer 270 in a conventional fashion.

Patterned photoresist layer 270 touches gate structures 236 and 238, and overlies to protect the n-type wells 217 and 220 and the p-type wells 225 and 226. After patterned photoresist layer 270 has been formed, donor-type impurity atoms are conventionally implanted through an opening in layer 270 into p-type well 223 and the n-type wells 218 and 219.

The implant forms an n+ source region 272 that touches source extension region 250, and an n+ drain region 274 that touches drain extension region 251. The implant also forms an n+ source region 276 that touches n-type well 218, and an n+ drain region 278 that touches n-type well 219. Following this, patterned photoresist layer 270 is removed in a conventional manner.

Figure 2L:
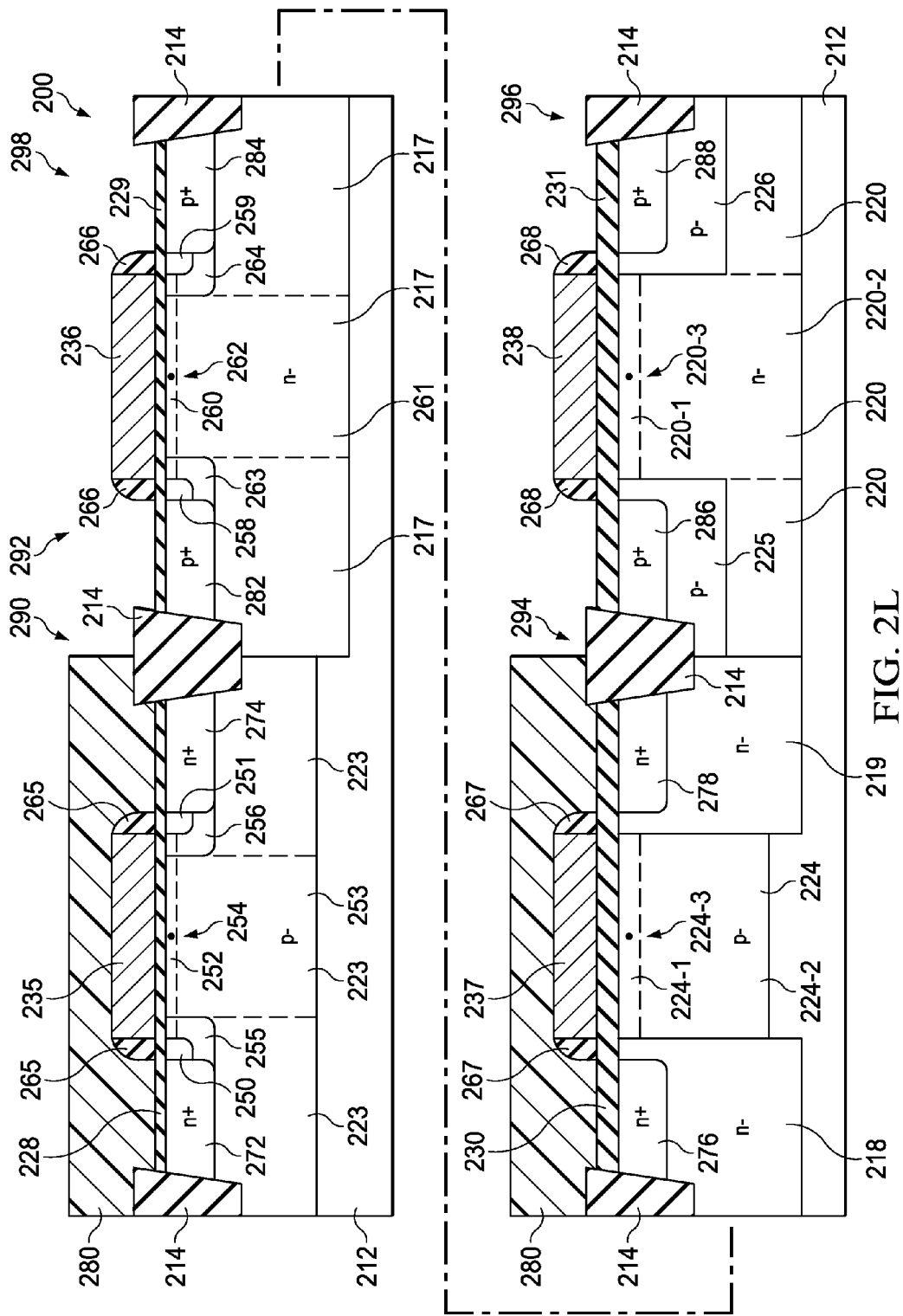

As shown in FIG. 2A, after the n+ source and drain regions for the core and I/O NMOS transistors have been formed, method 200 next moves to step 202-12 to form p+ source and drain regions for the core and I/O PMOS transistors. As shown in FIG. 2L, the p+ source and drain regions for the core and I/O NMOS transistors can be formed by first forming a patterned photoresist layer 280 in a conventional fashion.

Patterned photoresist layer 280 touches gate structures 235 and 237, and overlies to protect the p-type wells 223 and 224 and the n-wells 218 and 219. After patterned photoresist layer 280 has been formed, acceptor-type impurity atoms are conventionally implanted through an opening in layer 280 into n-type well 217, p-type well 225, and p-type well 226.

The implant forms a p+ source region 282 that touches source extension region 258, and a p+ drain region 284 that touches drain extension region 259. The implant also forms a p+ source region 286 that touches p-type well 225, and a p+ drain region 288 that touches p-type well 226. Following this, patterned photoresist layer 280 is removed in a conventional manner.

After the n+ source regions 272 and 276, the n+ drain regions 274 and 278, the p+ source region 282 and 286, and the p+ drain regions 284 and 288 have been formed, the n+ source regions 272 and 276, the n+ drain regions 274 and 278, the p+ source region 282 and 286, and the p+ drain regions 284 and 288 are driven in (e.g., annealed at 1100° C. in a neutral ambient such as $N_2$). Method 200 then continues with conventional steps to complete the formation of the CMOS structure.

None of the drive ins are sufficient to cause acceptor-type impurity atoms from p-type source 258/282 and p-type drain 259/284 to diffuse over to the middle point 262 of n-type channel region 260. As a result, n-type channel region 260 at the middle point 262 is substantially free of acceptor-type impurity atoms.

Further, none of the drive ins are sufficient to cause acceptor-type impurity atoms from p-type source 225/286 and p-type drain 226/288 to diffuse over to the middle point 220-3 of n-type channel region 220-1. As a result, n-type channel region 220-1 at the middle point 220-3 is substantially free of acceptor-type impurity atoms.

None of the drive ins are sufficient to cause donor-type impurity atoms from n-type source 250/272 and n-type drain 251/274 to diffuse over to the middle point 254 of p-type channel region 252. As a result, p-type channel region 252 at the middle point 254 is substantially free of donor-type impurity atoms.

Similarly, none of the drive ins are sufficient to cause donor-type impurity atoms from n-type source 218/276 and n-type drain 219/278 to diffuse over to the middle point 224-3 of p-type channel region 224-1. As a result, p-type channel region 224-1 at the middle point 224-3 is substantially free of donor-type impurity atoms.

P-type well 223, p-type channel region 252, p-type below-the-channel region 253, p-type halo 255, p-type halo 256, n-type source 250/272, n-type drain 251/274, gate dielectric structure 228, gate structure 235, and sidewall spacer 265 define a core NMOS transistor 290, which can be used to implement NMOS transistor 133.

Further, n-type well 217, n-type channel region 260, n-type below-the-channel region 261, n-type halo 263, n-type halo 264, p-type source 258/282, p-type drain 259/284, gate dielectric structure 229, gate structure 236, and sidewall spacer 266 define a core PMOS transistor 292, which can be used to implement PMOS transistor 172.

In addition, n-type well 218, n-type well 219, p-type well 224, n-type source 276, n-type drain 278, p-type channel region 224-1, p-type below-the-channel region 224-2, gate dielectric structure 230, gate structure 237, and sidewall spacer 267 define an I/O NMOS transistor 294, which can be used to implement NMOS transistor 150.

Further, n-type well 220, p-type well 225, p-type well 226, p-type source 286, p-type drain 288, n-type channel region 220-1, n-type below-the-channel region 220-2, gate dielectric structure 231, gate structure 238, and sidewall spacer 268 define an I/O PMOS transistor 296, which can be used to implement PMOS transistor 190. The transistors 290, 292, 294, and 296, in turn, form a dual gate dielectric CMOS structure 298.

One of the advantages of the present invention is that the present invention eliminates the need to use two patterned photoresist layers to form the source and drain extension regions for the NMOS and PMOS transistors in the I/O CMOS circuits. The elimination of the two patterned photoresist layers, and the reticles that are required to form them, significantly reduces the cost required to form a dual gate dielectric CMOS structure.

Figure 3:
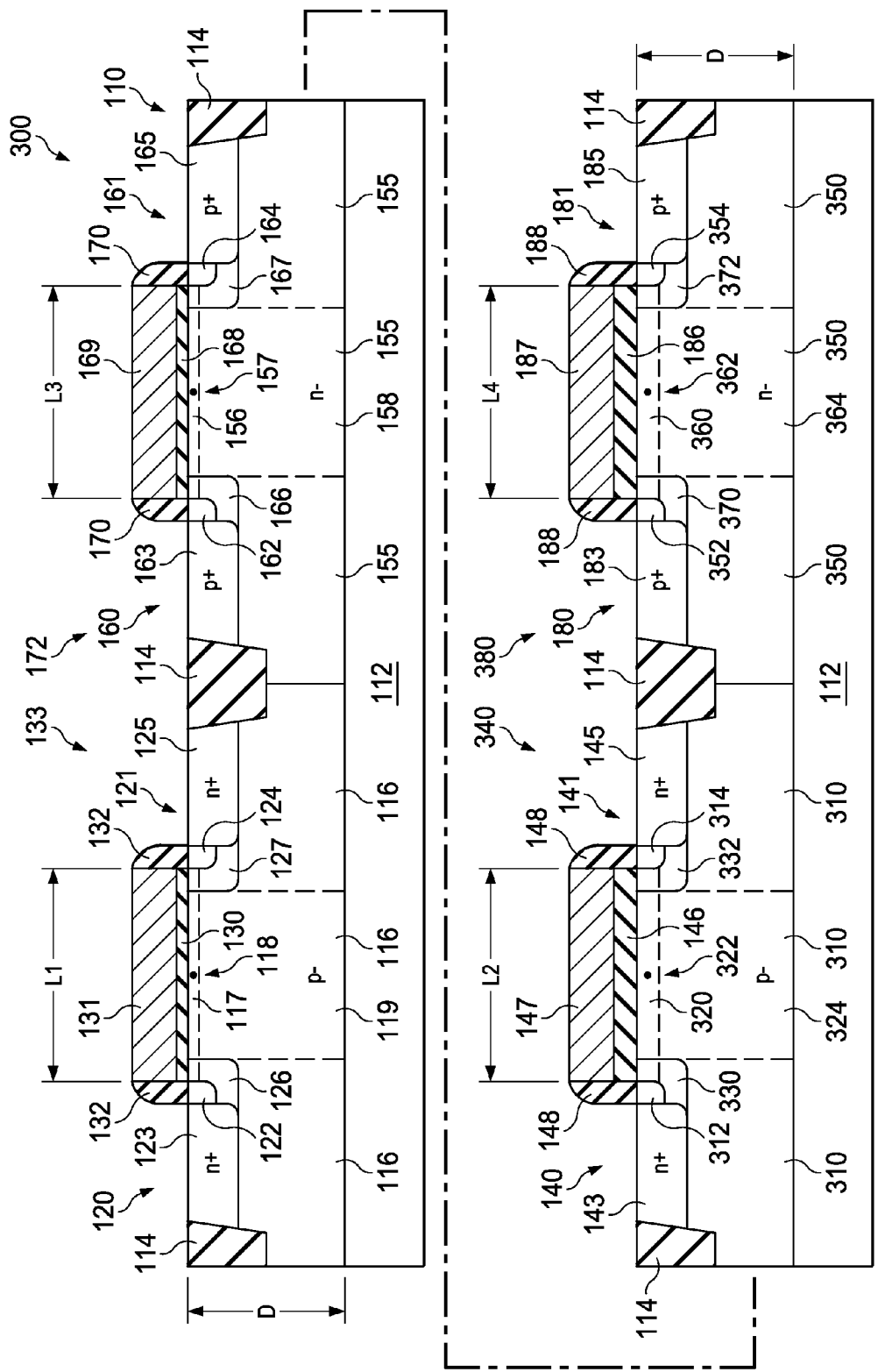
FIG. 3 is a cross-sectional view illustrating an example of a dual gate dielectric CMOS structure 300 in accordance with an alternate embodiment of the present invention.

FIG. 3 shows a cross-sectional view that illustrates an example of a dual gate dielectric CMOS structure 300 in accordance with an alternate embodiment of the present invention. CMOS structure 300 is similar to CMOS structure 100 and, as a result, utilizes the same reference numerals to designate the elements which are common to both structures.

As shown in FIG. 3, CMOS structure 300 differs from CMOS structure 100 in that base structure 110 utilizes a p-type body region 310 in lieu of p-type body region 135. CMOS structure 300 also differs from CMOS structure 100 in that n-type source 140 utilizes an n-type source extension region 312 in lieu of n-type source extension region 142, and n-type drain 141 utilizes an n-type drain extension region 314 in lieu of n-type drain extension region 144.

P-type body region 310, in turn, includes a p-type channel region 320, a middle point 322 of channel region 320, and a p-type below-the-channel region 324 that touches and lies directly below p-type channel region 320. P-type channel region 320 at the middle point 322 is substantially free of donor-type impurity atoms.

In addition, p-type channel region 320 has a channel length L2 that is substantially greater (e.g., 10X) than the channel length L1 of p-type channel region 117, and an average dopant concentration that is substantially less than the average dopant concentration of p-type channel region 117. In addition, p-type below-the-channel region 324 has a dopant profile directly below middle point 322 that is substantially identical to the dopant profile of p-type below-the-channel region 119 directly below middle point 118.

Base structure 110 can also optionally include a p-type halo 330 that touches p-type body region 310 and n-type source 140, and a p-type halo 332 that touches p-type body region 310 and n-type drain 141. The p-type halos 330 and 332, which are spaced apart, have higher average dopant concentrations than the adjoining portions of below-the-channel region 324. (The halos 330 and 332 can be omitted in high-voltage applications.)

The combination of p-type body region 310, p-type channel region 320, p-type below-the-channel region 324, n-type source 140 (including source extension region 312), n-type drain 141 (including drain extension region 314), p-type halo 330, p-type halo 332, thick gate dielectric structure 146, conductive gate 147, and sidewall spacer 148 define a thick gate dielectric (I/O) NMOS transistor 340.

As further shown in FIG. 3, CMOS structure 300 also differs from CMOS structure 100 in that base structure 110 utilizes an n-type body region 350 in lieu of n-type body region 175. CMOS structure 300 also differs from CMOS structure 100 in that p-type source 180 utilizes a p-type source extension region 352 in lieu of p-type source extension region 182, and p-type drain 181 utilizes a p-type drain extension region 354 in lieu of p-type drain extension region 184.

N-type body region 350, in turn, includes an n-type channel region 360, a middle point 362 of channel region 360, and an n-type below-the-channel region 364 that touches and lies directly below n-type channel region 360. N-type channel region 360 at the middle point 362 is substantially free of acceptor-type impurity atoms.

In addition, n-type channel region 360 has a channel length L4 that is substantially greater (e.g., 10X) than the channel length L3 of n-type channel region 156, and an average dopant concentration that is substantially less than the average dopant concentration of n-type channel region 156. In addition, n-type below-the-channel region 364 has a dopant profile directly below middle point 362 that is substantially identical to the dopant profile of n-type below-the-channel region 158 directly below middle point 157.

Base structure 110 can also optionally include an n-type halo 370 that touches n-type body region 350 and p-type source 180, and an n-type halo 372 that touches n-type body region 350 and p-type drain 181. The n-type halos 370 and 372, which are spaced apart, have higher average dopant concentrations than the adjoining portions of below-the-channel region 364. (The halos 370 and 372 can be omitted in high-voltage applications.)

The combination of n-type body region 350, n-type channel region 360, n-type below-the-channel region 364, p-type source 180 (including source extension region 352), p-type drain 181 (including drain extension region 354), n-type halo 370, n-type halo 372, thick gate dielectric structure 186, conductive gate 187, and sidewall spacer 188 define a thick gate dielectric (I/O) NMOS transistor 380.

In the present example, each of the body regions 116, 155, 310, 350 has substantially the same depth D. (Alternately, the p-type body regions 116 and 310 can have a greater or lesser maximum depth than the n-type body regions 155 and 350.) Further, the p-type body regions 116 and 310 are spaced apart from each other, while n-type body regions 155 and 350 are spaced apart from each other. NMOS transistor 340 operates substantially the same as NMOS transistor 150, while PMOS transistor 380 operate substantially the same as PMOS transistor 190.

Figure 4B:
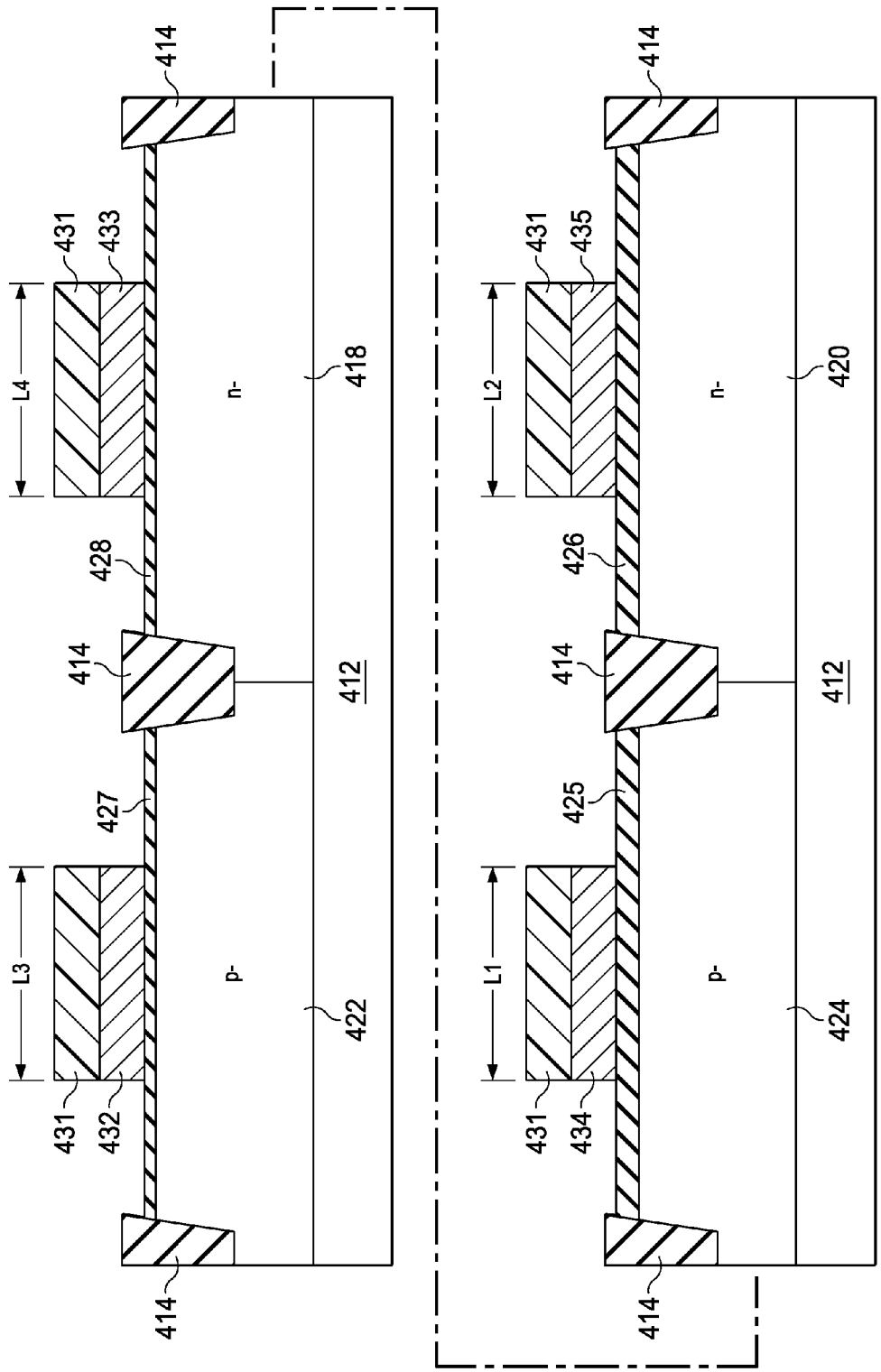

FIGS. 4A-4I illustrate an example of a method 400 of forming a dual gate dielectric CMOS structure in accordance with an alternate embodiment of the present invention. FIG. 4A shows a flow chart of method 400, while FIGS. 4B-4I show cross-sectional views of method 400. In the present example, method 400 forms the NMOS and PMOS transistors of a core CMOS circuit and the NMOS and PMOS transistors of an I/O CMOS circuit.

Method 400 begins the same as method 200 and, as a result, utilizes the same reference numeral to designate the step that is common to both methods. As shown in FIG. 4A, method 400 also begins with step 202-1, which is the formation of a trench isolation structure. As shown in FIG. 4B, method 400 utilizes a p-type substrate 412, and forms a trench isolation structure 414 in substrate 412. In the present example, method 400 also leaves a remaining isolation stack.

As further shown in FIG. 4A, after the trench isolation structure has been formed (e.g., after all or a portion of the isolation stack has been removed), method 400 next moves to step 402-2 to form an n-type core well and an n-type I/O well in the substrate. The n-type wells can be formed in a similar manner to the formation of n-type well 217 by first forming a patterned photoresist layer in a conventional manner to touch and lie over the remaining isolation stack.

After the patterned photoresist layer has been formed, donor-type (n-type) impurity atoms, such as phosphorous or arsenic, are implanted into the p-type substrate with multiple implant energies (chain implants) in a conventional manner. As shown in FIG. 4B, the n-type implant forms an n-type core well 418 and an n-type I/O well 420 that each touches p-type substrate 412.

As a result of being simultaneously formed, the n-type wells 418 and 420 each has substantially the same maximum depth and the same dopant profile. Further, the upper regions of the n-type wells 418 and 420 have the same average dopant concentration, which is selected (in combination with the dopant concentration of any to-be-formed n-type halos) for n-type well 420 to set the threshold voltage of a to-be-formed PMOS transistor for the I/O CMOS circuit. Following the implant, the patterned photoresist layer is removed in a conventional fashion.

As shown in FIG. 4A, method 400 next moves to step 402-3 to form a p-type core well and a p-type I/O well in the substrate. The p-type wells can be formed in a similar manner to the formation of p-type well 223 by first forming a patterned photoresist layer in a conventional manner to touch and lie over the remaining isolation stack, and cover the n-type wells 418 and 420.

After the patterned photoresist layer has been formed, acceptor-type (p-type) dopant atoms, such as boron, are implanted into the p-type substrate with multiple implant energies (chain implants) in a conventional fashion. As shown in FIG. 4B, the p-type implant forms a p-type core well 422 and a p-type I/O well 424 that each touch p-type substrate 412.

As a result of being simultaneously formed, the p-type wells 422 and 424 each has substantially the same maximum depth and the same dopant profile. Further, the upper regions of the p-type wells 422 and 424 have the same average dopant concentration, which is selected (in combination with the dopant concentration of any to-be-formed p-type halos) for p-type well 424 to set the threshold voltage of a to-be-formed NMOS transistor for the I/O CMOS circuit. Following the implant, the patterned photoresist layer is removed in a conventional fashion. After the patterned photoresist layer has been removed, the n-type wells 418 and 420, and the p-type wells 422 and 424 are driven in (e.g., annealed at 1100° C. in a neutral ambient such as $N_2$).

As shown in FIG. 4A, after the p-type core well and the p-type I/O well have been formed, method 400 next moves to step 402-4 to form a thin gate dielectric layer on the n-type and p-type core wells, and a thick gate dielectric layer on the n-type and p-type I/O wells. The thin and thick gate dielectric layers can be formed in a similar manner to the formation of the thin and thick gate dielectric layers 228-2, 229-2, 231, and 232 by first removing the remaining isolation stack, followed by a conventional cleaning process to prepare the top surfaces of the wells 418, 420, 422, and 424 for thermal oxide growth.

Following this, a gate dielectric structure is grown on well 422, a gate dielectric structure is grown on well 418, a gate dielectric structure 425 is grown on well 424, and a gate dielectric structure 426 is grown on well 420. The gate dielectric structures are simultaneously formed. The growth continues until the thicknesses of the gate dielectric structures reach the thickness required by the NMOS and PMOS transistors in the I/O CMOS circuits (e.g., 75 Å-200 Å).

Once the required thickness has been reached, the growth is stopped and a patterned photoresist layer is formed in a conventional manner to touch and protect the gate dielectric structures 425 and 426. After the patterned photoresist layer has been formed, the gate dielectric structures grown on the wells 418 and 422 are removed to re-expose the top surfaces of the wells 418 and 422. Following this, a conventional cleaning process is used to prepare the top surfaces of the wells 418 and 422 for thermal oxide growth.

Next, a gate dielectric structure 427 is grown on well 422 and a gate dielectric structure 428 is grown on well 418 at the same time. The growth continues until the thicknesses of the gate dielectric structures 427 and 428 reach the thickness required by the NMOS and PMOS transistors in the core CMOS circuits (e.g., 15 Å-30 Å). Once the required thickness has been reached, the growth is stopped and the patterned photoresist layer is then removed in a conventional fashion.

As shown in FIG. 4A, after the thin and thick gate dielectric structures have been formed, method 400 next moves to step 402-5 to form gate structures on the thin and thick gate dielectric structures. The gate structures can be formed in a similar manner to the formation of the gate structures 235, 236, 237, and 238 by first depositing a polycrystalline silicon layer approximately 1500 Å thick on the gate dielectric structures 425, 426, 427, and 428 in a conventional fashion.

Following this, as shown in FIG. 4B, a patterned photoresist layer 431 is formed in a conventional manner to touch the polycrystalline silicon layer. Next, as further shown in FIG. 4B, the exposed regions of the polycrystalline silicon layer are etched in a conventional fashion to form a gate that touches gate dielectric structure 425, a gate that touches gate dielectric structure 426, a gate that touches gate dielectric structure 427, and a gate that touches gate dielectric structure 428. After the gates have been formed, patterned photoresist layer 431 is removed in a conventional manner.

The exposed surfaces of the gates are then oxidized to form a gate structure 432 that touches gate dielectric structure 427, a gate structure 433 that touches gate dielectric structure 428, a gate structure 434 touches gate dielectric structure 425, and a gate structure 435 that touches gate dielectric structure 426. The gate structures 434 and 435 are formed to have a length L1 and L2, respectively, which are longer (e.g., 10X) than the lengths L3 and L4 of the gate structures 432 and 433, respectively. At this point, a thin offset spacer can be optionally formed by depositing a thin non-conductive layer, and then anisotropically etching the thin non-conductive layer to form the offset spacer.

Figure 4C:
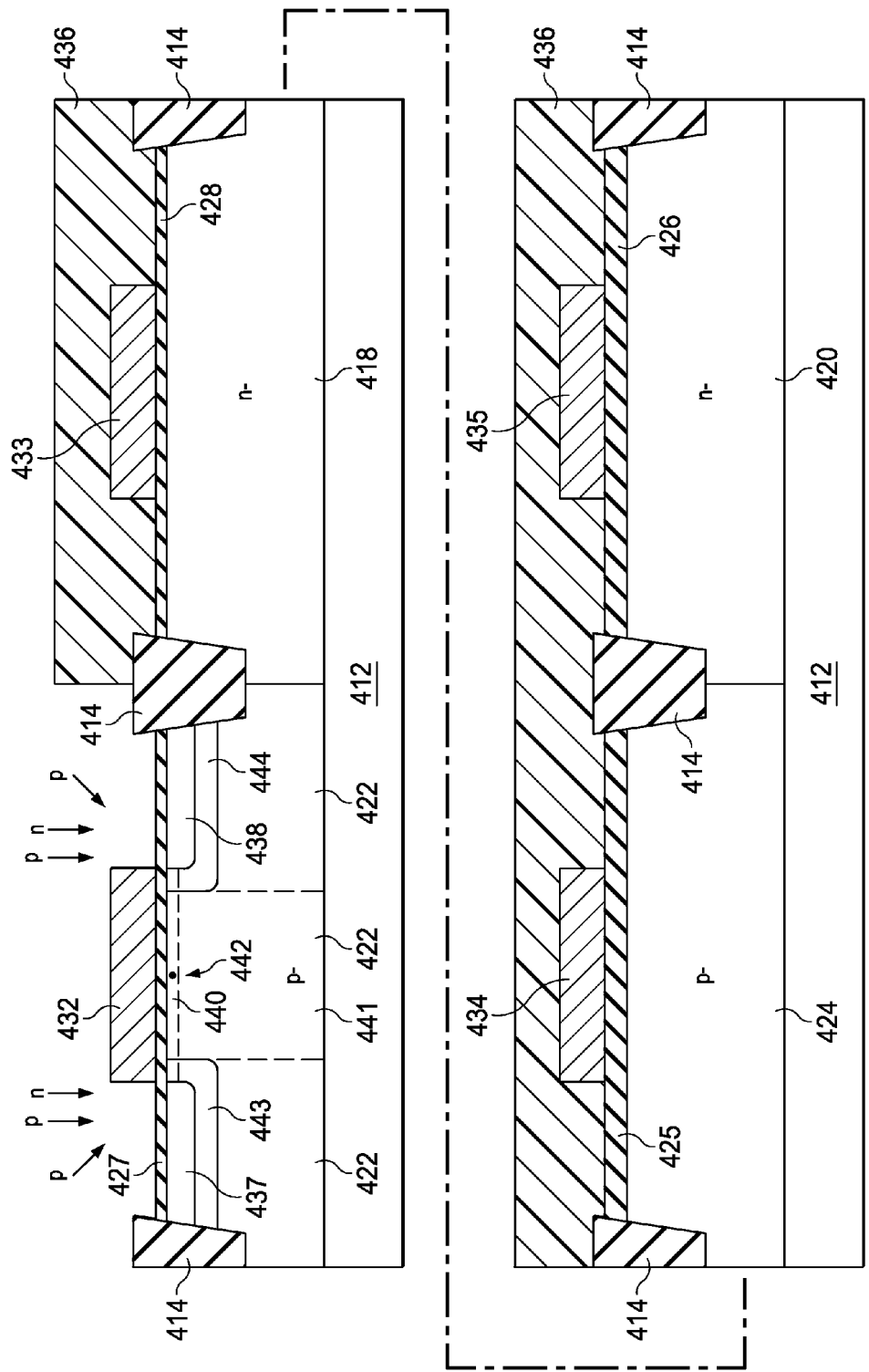

As shown in FIG. 4A, after the gate structures have been formed, method 400 next moves to step 402-6 to form an n-type core source extension region and an n-type core drain extension region. As shown in FIG. 4C, the n-type core source and drain extension regions can be formed by first forming a patterned photoresist layer 436 in a conventional manner. Patterned photoresist layer 436 touches the gate structures 433, 434, and 435, and overlies to protect the n-wells 418 and 420, and p-well 424.

When patterned photoresist layer 436 is formed, p-type well 422 includes the acceptor-type impurity atoms. In addition, p-type well 422 is substantially free of the donor-type impurity atoms. Further, the p-type wells 422 and 424 have substantially identical dopant profiles. After patterned photoresist layer 436 has been formed, donor-type (n-type) impurity atoms are implanted through an opening in patterned photoresist layer 436 into p-type well 422 in a conventional manner. The n-type implant forms an n-type core source extension region 437 and an n-type core drain extension region 438 in p-type well 422.

The implant also defines a p-type channel region 440 that lies between n-type core source extension region 437 and n-type core drain extension region 438, and a p-type below-the-channel region 441 of p-type well 422 that touches and lies below p-type channel region 440. P-type channel region 440, in turn, has an average dopant concentration and a middle point 442 that lies mid-way between the extension regions 437 and 438. P-type channel region 440 at middle point 442 includes the acceptor-type of impurity atoms. In addition, p-type channel region 440 at middle point 442 is substantially free of the donor-type of impurity atoms. P-type below-the-channel region 441 has a dopant profile directly below middle point 442.

As shown in FIG. 4A, after the n-type core source extension region and the n-type core n-type drain extension region have been formed, method 400 next moves to step 402-7 to set the threshold voltage of the core NMOS transistor. As shown in FIG. 4C, the threshold voltage of the core NMOS transistor can be set by implanting acceptor-type (p-type) dopant atoms through the opening in layer 436 into p-type well 422 in a conventional fashion to increase the average dopant concentration of p-type channel region 440.

The implant energy of the p-type implant is selected to penetrate through gate structure 432 into p-type well 422. The dose is selected (in combination with the dopant concentration of any to-be-formed p-type halos) to set the threshold voltage of a to-be-formed NMOS transistor for the core CMOS circuit by raising the concentration of acceptor-type impurity atoms in channel region 440.

One of the advantages of the present invention is the p-type implant used to adjust the threshold voltage of the to-be-formed core NMOS transistor is additive, i.e., the p-type implant raises the concentration of p-type atoms that are present at the top surface of p-type well 422. This, in turn, leads to less variation in the threshold voltage when compared to the counter doping approach of one of the prior art approaches. Further, the p-type dopant is implanted through thin gate dielectric structure 427, which requires less implant energy and therefore results in less threshold voltage variation.

Next, as shown in FIG. 4C, the threshold voltage of the core NMOS transistor is further set by forming source and drain halos for the core NMOS transistor. The source and drain halos for the core NMOS transistor can be formed by again implanting acceptor-type impurity atoms through the opening in layer 436, this time at a number of angles to form a p-type halo 443 and a p-type halo 444 in p-type well 422. Gate structure 432 blocks the halo implants. As a result, the angled implants allow the halos 443 and 444, which have higher dopant concentrations than the adjoining portions of below-the-channel region 441, to extend under the ends of gate structure 432.

Another of the advantages of the present invention is the p-type implant used to adjust the threshold voltage of the to-be-formed core NMOS transistor reduces the dose required to form the halos 443 and 444, which results in better transistor performance. (The halos 443 and 444 can optionally be omitted.) After the p-type halos 443 and 444 have been formed, patterned photoresist layer 436 is removed in a conventional fashion. (The order that the impurity atoms are implanted can be reversed or otherwise altered.)

Figure 4D:
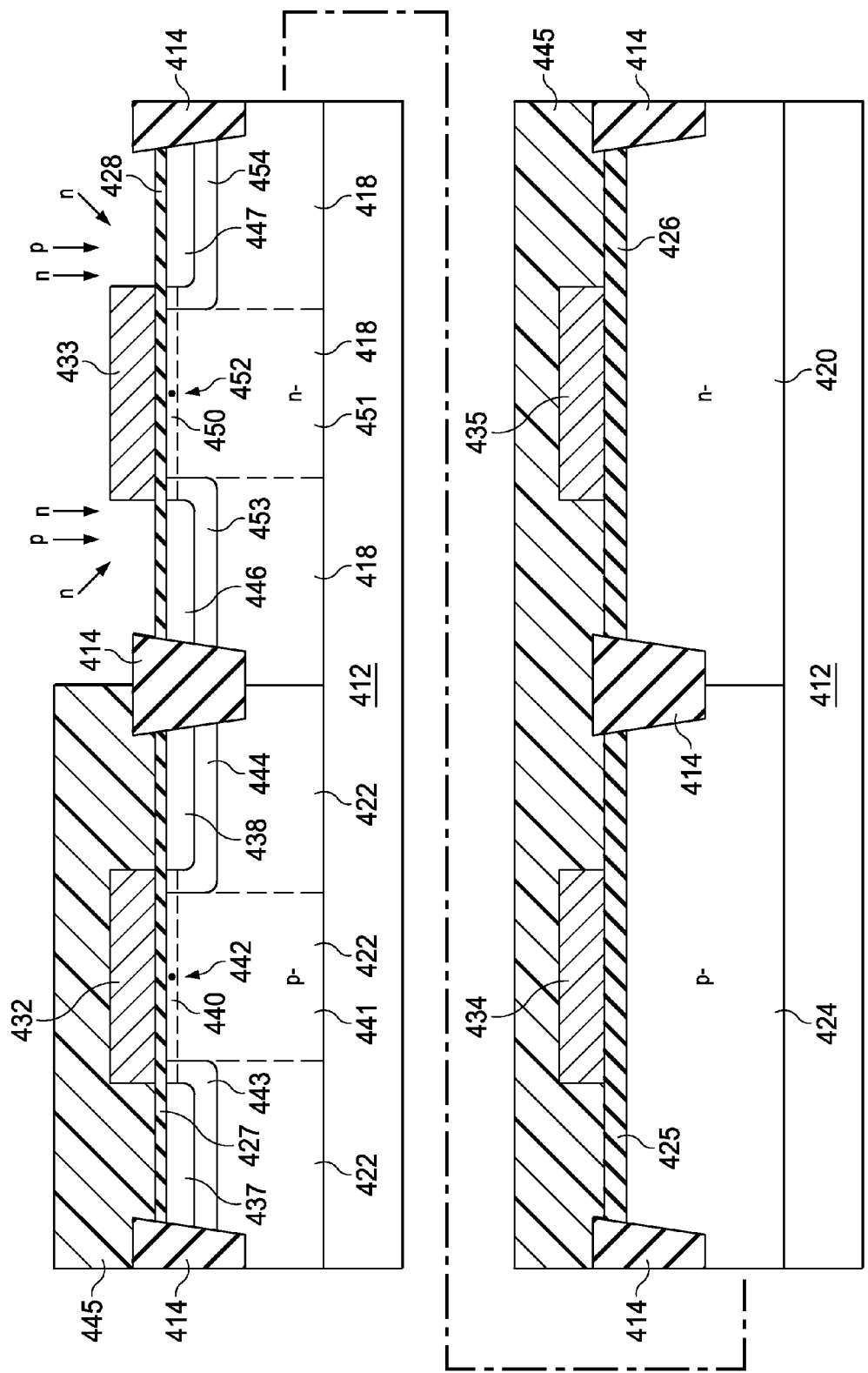

As shown in FIG. 4A, after the threshold voltage for the core NMOS transistor has been set, method 400 next moves to step 402-8 to form a p-type core source extension region and a p-type core drain extension region. As shown in FIG. 4D, the p-type core source and drain extension regions can be formed by first forming a patterned photoresist layer 445 in a conventional manner. Patterned photoresist layer 445 touches the gate structures 432, 434, and 435, and overlies to protect n-well 420 and the p-wells 422 and 424. When patterned photoresist layer 445 is formed, n-type well 418 includes the donor-type impurity atoms. In addition, n-type well 418 is substantially free of the acceptor-type impurity atoms. Further, the n-type wells 418 and 420 have substantially identical dopant profiles.

After patterned photoresist layer 445 has been formed, acceptor-type (p-type) impurity atoms are implanted through an opening in layer 445 into n-type well 418 in a conventional manner. The p-type implant forms a p-type core source extension region 446 and a p-type core drain extension region 447 in n-type well 418.

The implant also defines an n-type channel region 450 that lies between the p-type core source and drain extension regions 446 and 447, and an n-type below-the-channel region 451 of n-type well 418 that touches and lies below n-type channel region 450. N-type channel region 450, in turn, has an average dopant concentration and a middle point 452 that lies mid-way between the extension regions 446 and 447.

As shown in FIG. 4A, after the core p-type source extension region and the core p-type drain extension region have been formed, method 400 next moves to step 402-9 to set the threshold voltage of the core PMOS transistor. As shown in FIG. 4D, the threshold voltage of the core PMOS transistor can be set by implanting donor-type (n-type) impurity atoms through the opening in layer 445 into n-type well 418 in a conventional fashion to increase the average dopant concentration of n-type channel region 450.

The implant energy of the n-type implant is selected to penetrate through gate structure 433 into n-type well 418. The dose is selected (in combination with the dopant concentration of any to-be-formed n-type halos) to set the threshold voltage of a to-be-formed core PMOS transistor in n-type well 418 by raising the concentration of donor-type impurity atoms in channel region 450.

One of the advantages of the present invention is the n-type implant used to adjust the threshold voltage of the to-be-formed core PMOS transistor is additive, i.e., the n-type implant raises the concentration of n-type atoms that are present in channel region 450. This, in turn, leads to less variation in the threshold voltage when compared to the counter doping approach of one of the prior art approaches. Further, the n-type dopant is implanted through thin gate dielectric structure 428, which requires less implant energy and therefore results in less threshold voltage variation.

Next, as shown in FIG. 4D, the threshold voltage of the core PMOS transistor is further set by forming source and drain halos for the core PMOS transistor. The source and drain halos for the core PMOS transistor can be formed by again implanting the donor-type impurity atoms through the opening in layer 445, this time at a number of angles to form an n-type halo 453 and an n-type halo 454 in n-type well 418. Gate structure 433 blocks the halo implants. As a result, the angled implants allow the halos 453 and 454, which have higher dopant concentrations than the adjoining portions of below-the-channel region 451, to extend under the ends of gate structure 433.

Another of the advantages of the present invention is the n-type implant used to adjust the threshold voltage of the to-be-formed core PMOS transistor reduces the dose required to form the halos 453 and 454, which results in better transistor performance. (The halos 453 and 454 can optionally be omitted.) After the n-type halos 453 and 454 have been formed, patterned photoresist layer 445 is removed in a conventional fashion. (The order that the impurity atoms are implanted can be reversed or otherwise altered.)

Figure 4E:
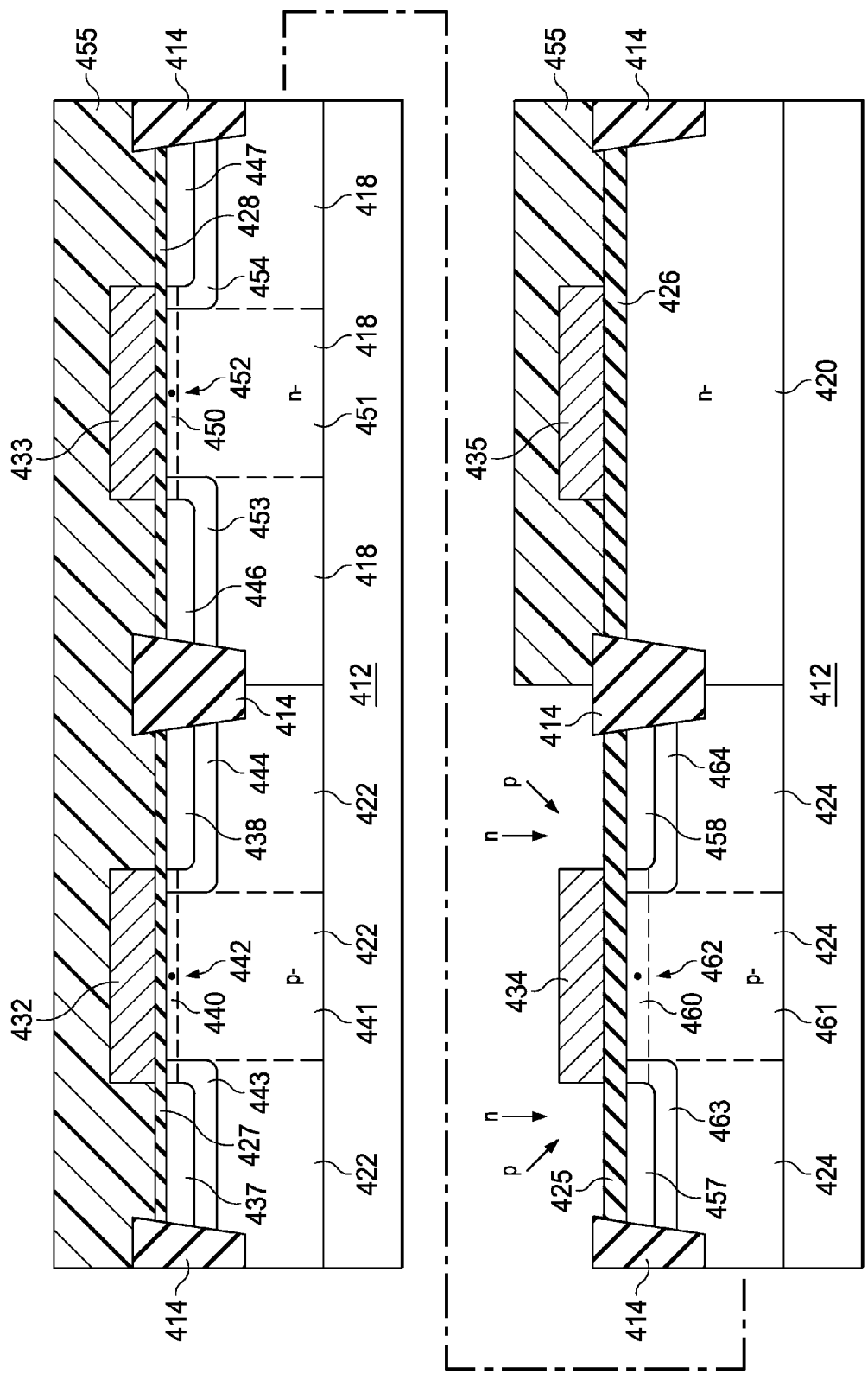

As shown in FIG. 4A, after the threshold voltage of the core PMOS transistor has been set, method 400 next moves to step 402-10 to form an n-type I/O source extension region and an n-type I/O drain extension region. As shown in FIG. 4E, the n-type I/O source and drain extension regions can be formed by first forming a patterned photoresist layer 455 in a conventional manner. Patterned photoresist layer 455 touches the gate structures 432, 433, and 435, and overlies to protect the n-wells 418 and 420, and p-well 422.

When patterned photoresist layer 455 is formed, p-type well 424 includes the acceptor-type impurity atoms. In addition, p-type well 424 is substantially free of the donor-type impurity atoms. After patterned photoresist layer 455 has been formed, donor-type (n-type) impurity atoms are implanted through an opening in patterned photoresist layer 455 into p-type well 424 in a conventional manner. The n-type implant forms an n-type source extension region 457 and an n-type drain extension region 458 in p-type well 424.

The implant also defines a p-type channel region 460 that lies between n-type source extension region 457 and n-type drain extension region 458, and a p-type below-the-channel region 461 of p-type well 424 that touches and lies below p-type channel region 460. P-type channel region 460, in turn, has an average dopant concentration and a middle point 462 that lies mid-way between the extension regions 457 and 458. P-type channel region 460 at middle point 462 includes the acceptor-type of impurity atoms. In addition, p-type channel region 460 at middle point 462 is substantially free of the donor-type of impurity atoms. P-type below-the-channel region 461 has a dopant profile directly below middle point 462.

As shown in FIG. 4A, after the n-type I/O source extension region and the n-type I/O n-type drain extension region have been formed, method 400 next moves to step 402-11 to form source and drain halos for the I/O NMOS transistor. As shown in FIG. 4E, the source and drain halos for the I/O NMOS transistor can be formed by implanting acceptor-type impurity atoms through the opening in layer 455 at a number of angles to form a p-type halo 463 and a p-type halo 464 in p-type well 424. Gate structure 434 blocks the halo implants. As a result, the angled implants allow the halos 463 and 464, which have higher dopant concentrations than the adjoining portions of below-the-channel region 461, to extend under the ends of gate structure 434. (The halos 463 and 464 can optionally be omitted.) After the p-type halos 463 and 464 have been formed, patterned photoresist layer 455 is removed in a conventional fashion. (The order that the impurity atoms are implanted can be reversed or otherwise altered.)

Thus, unlike p-type channel region 440, where additional acceptor-type impurity atoms were implanted into p-type channel region 440 to raise the average dopant concentration when patterned photoresist layer 436 was in place, no additional acceptor-type impurity atoms were implanted into p-type channel region 460 when patterned photoresist layer 455 was in place.

Figure 5:
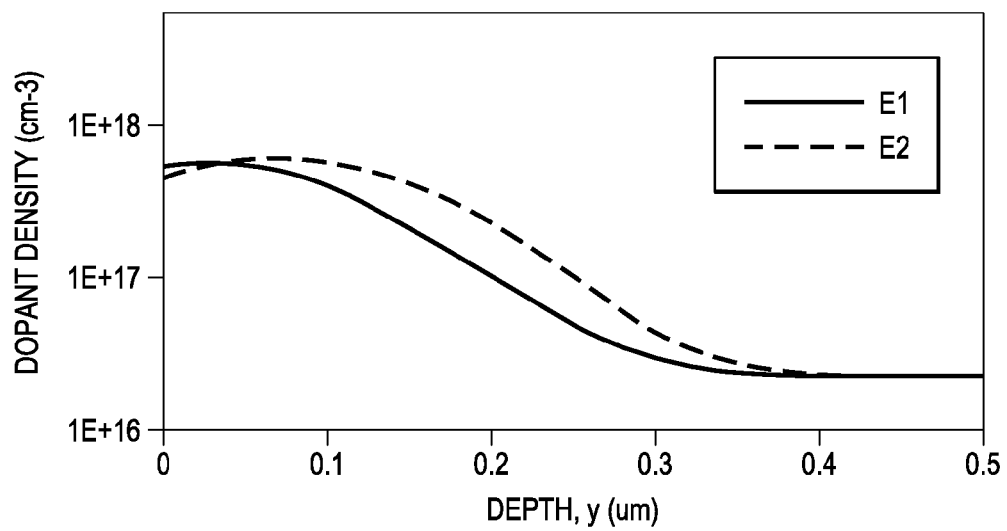
FIG. 5 is a graph illustrating the boron dopant profile of an NMOS core well below an overlying gate in accordance with the present invention.

FIG. 5 shows a graph that illustrates the boron dopant profile of an NMOS core well below an overlying gate in accordance with the present invention. As shown in FIG. 5, line E1 illustrates the concentration of acceptor-type impurity atoms in core well 422 below gate 432. (Alternately, line E1 can illustrate the concentration of acceptor-type impurity atoms in core well 223 below gate 235.) By comparison, line E2 illustrates the concentration of acceptor-type impurity atoms in a prior art core well below the gate where the core well received the well implants alone (i.e., no through-the-gate core well implants).

As a result, due to the implantation of p-type dopant atoms into p-type channel region 440, p-type channel region 440 at middle point 442 has a higher average dopant concentration than the average dopant concentration of p-type channel region 460 at middle point 462. However, because the dopant profiles of the p-type wells 422 and 424 were initially the same, the dopant profiles of below-the-channel region 441 and below-the-channel region 461 remain substantially identical.

Figure 4F:
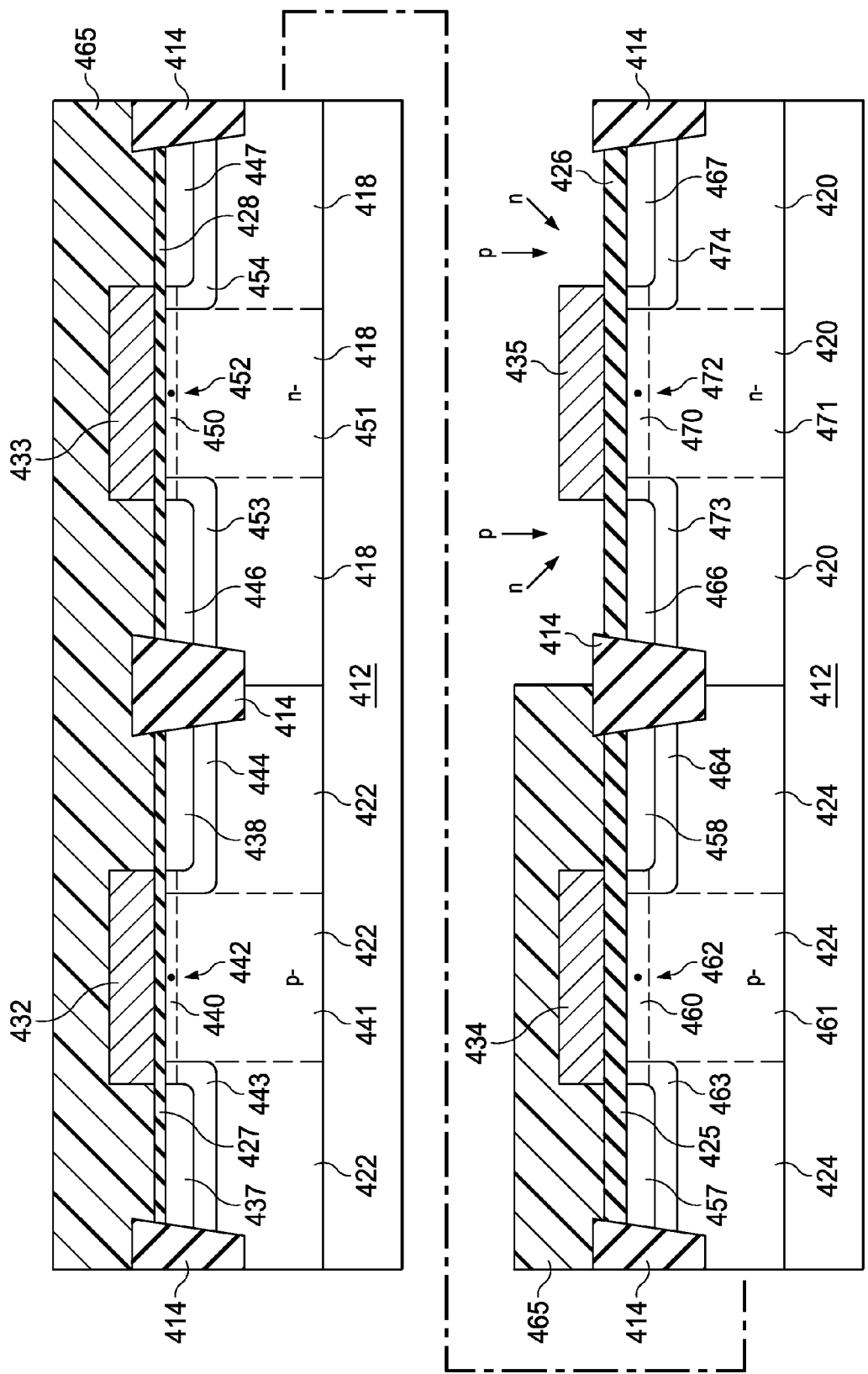

As shown in FIG. 4A, after the source and drain halos for the I/O NMOS transistor has been formed, method 400 next moves to step 402-12 to form a p-type I/O source extension region and a p-type I/O drain extension region. As shown in FIG. 4F, the p-type I/O source and drain regions can be formed by first forming a patterned photoresist layer 465 in a conventional manner. Patterned photoresist layer 465 touches the gate structures 432, 433, and 434, and overlies to protect n-well 418 and the p-wells 422 and 424.

After patterned photoresist layer 465 has been formed, acceptor-type (p-type) impurity atoms are implanted through an opening in layer 465 into n-type well 420 in a conventional manner. The p-type implant forms a p-type source extension region 466 and a p-type drain extension region 467 in n-type well 420.

The implant also defines an n-type channel region 470 that lies between the p-type source and drain extension regions 466 and 467, and an n-type below-the-channel region 471 of n-type well 420 that touches and lies below n-type channel region 470. N-type channel region 470, in turn, has an average dopant concentration and a middle point 472 that lies midway between the extension regions 466 and 467.

As shown in FIG. 4A, after the p-type I/O source extension region and the p-type I/O drain extension region have been formed, method 400 next moves to step 402-13 to form source and drain halos for the I/O PMOS transistor. As shown in FIG. 4F, the source and drain halos for the I/O PMOS transistor can be formed by implanting donor-type impurity atoms through the opening in layer 465 at a number of angles to form a p-type halo 473 and a p-type halo 474 in p-type well 420. Gate structure 435 blocks the halo implants. As a result, the angled implants allow the halos 473 and 474, which have higher dopant concentrations than the adjoining portions of below-the-channel region 471, to extend under the ends of gate structure 435. (The halos 473 and 474 can optionally be omitted.) After the p-type halos 473 and 474 have been formed, patterned photoresist layer 465 is removed in a conventional fashion. (The order that the impurity atoms are implanted can be reversed or otherwise altered.)

Thus, unlike n-type channel region 450, where additional donor-type impurity atoms were implanted into n-type channel region 450 to raise the average dopant concentration when patterned photoresist layer 445 was in place, no additional donor-type impurity atoms were implanted into n-type channel region 470 when patterned photoresist layer 465 was in place.

As a result, due to the implantation of n-type dopant atoms into n-type channel region 450, n-type channel region 450 has a higher average dopant concentration at middle point 452 than the average dopant concentration of n-type channel region 470 at middle point 472. However, because the dopant profiles of the n-type wells 418 and 420 were initially the same, the dopant profiles of below-the-channel region 451 and below-the-channel region 471 remain substantially identical.

After patterned photoresist layer 465 has been removed, the extension regions 437, 438, 453, 454, 457, 458, 473, and 474, the halos 443, 444, 453, 454, 463, 464, 473, and 474, and the implants into the channel regions 440 and 450 are driven in (e.g., annealed at 1100° C. in a neutral ambient such as $N_2$).

Figure 4G:
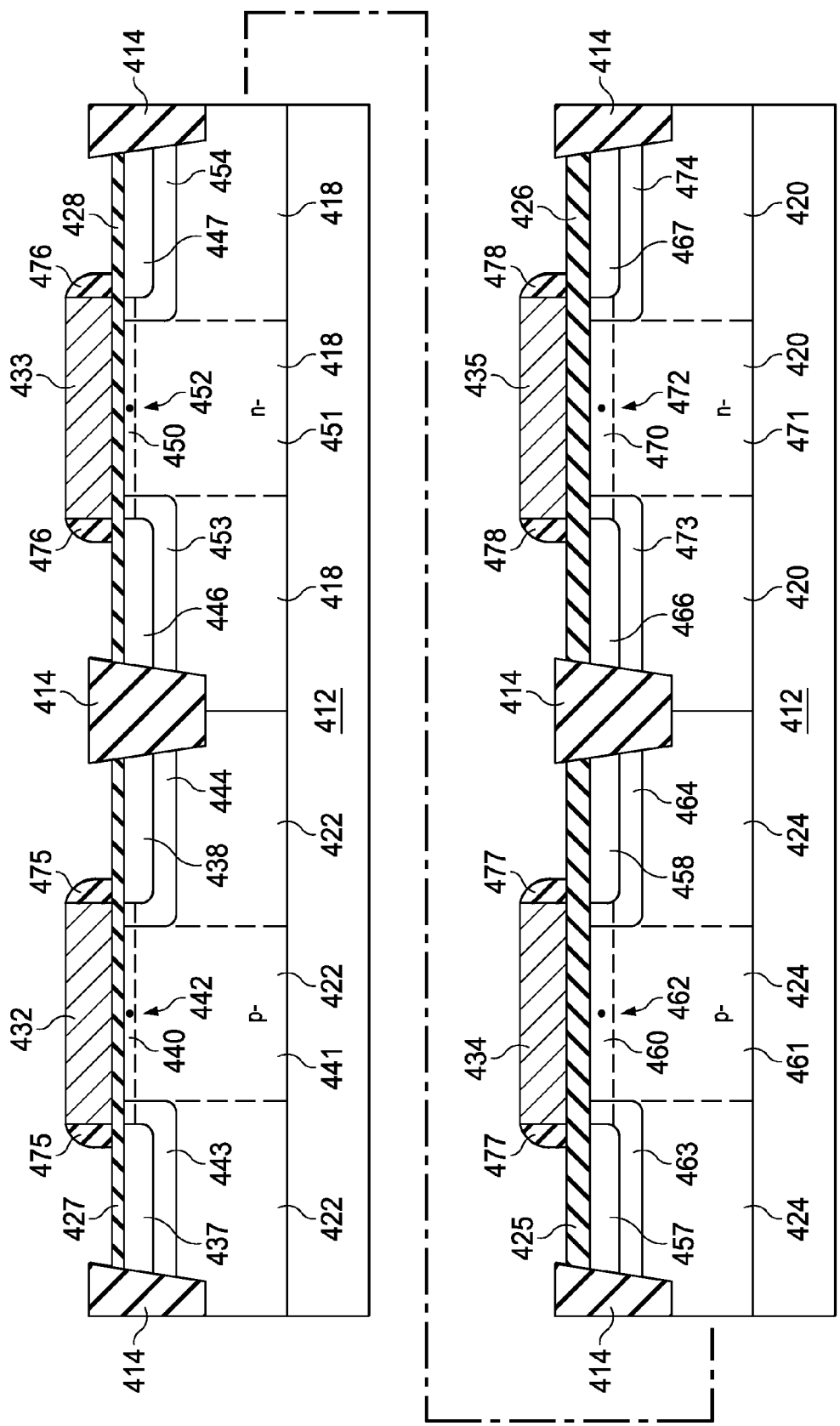

As shown in FIG. 4A, after the source and drain halos for the I/O PMOS transistor has been formed, method 400 next moves to step 402-14 to form side wall spacers. As shown in FIG. 4G, the side wall spacers can be formed by depositing a non-conductive layer in a conventional manner to touch the gate dielectric structures 425, 426, 427, and 428, and the gate structures 432, 433, 434, and 435. The non-conductive layer can be implemented with, for example, an oxide layer.

Following this, the non-conductive layer is anisotropically etched to form a sidewall spacer 475 that laterally surrounds gate structure 432, a sidewall spacer 476 that laterally surrounds gate structure 433, a sidewall spacer 477 that laterally surrounds gate structure 434, and a sidewall spacer 478 that laterally surrounds gate structure 435.

Figure 4H:
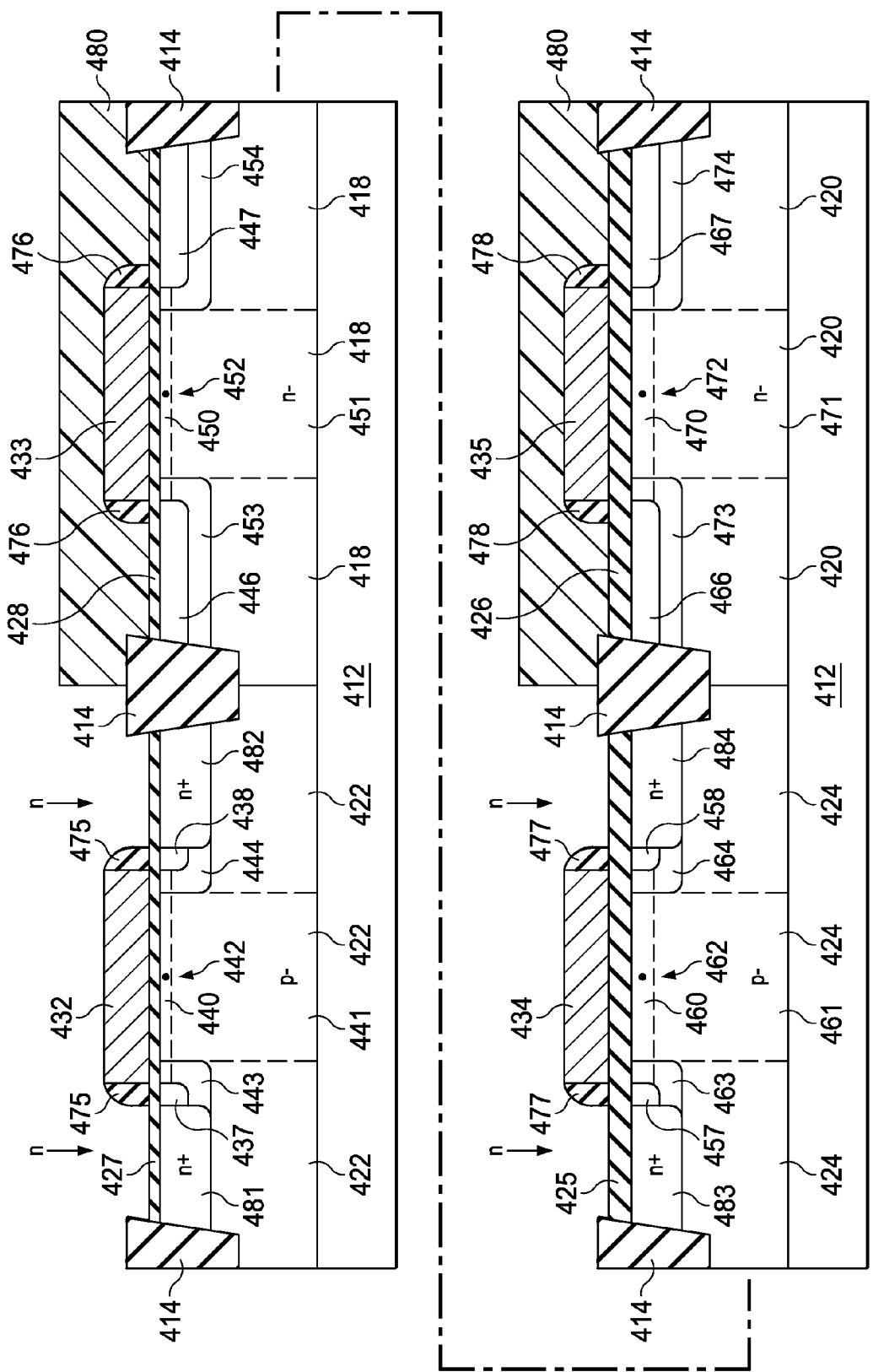

As shown in FIG. 4A, after the side wall spacers have been formed, method 400 next moves to step 202-15 to form n+ source and drain regions for the core and I/O NMOS transistors. As shown in FIG. 4H, the n+ source and drain regions for the core and I/O NMOS transistors can be formed by first forming a patterned photoresist layer 480 in a conventional fashion.

Patterned photoresist layer 480 touches gate structures 433 and 435, and overlies to protect the n-type wells 418 and 420. After patterned photoresist layer 480 has been formed, donor-type impurity atoms are conventionally implanted through an opening in layer 480 into the p-type wells 422 and 424.

The implant forms an n+ source region 481 that touches source extension region 437, and an n+ drain region 482 that touches drain extension region 438. The implant also forms an n+ source region 483 that touches source extension region 457, and an n+ drain region 484 that touches drain extension region 458. Following this, patterned photoresist layer 480 is removed in a conventional manner.

Figure 4I:
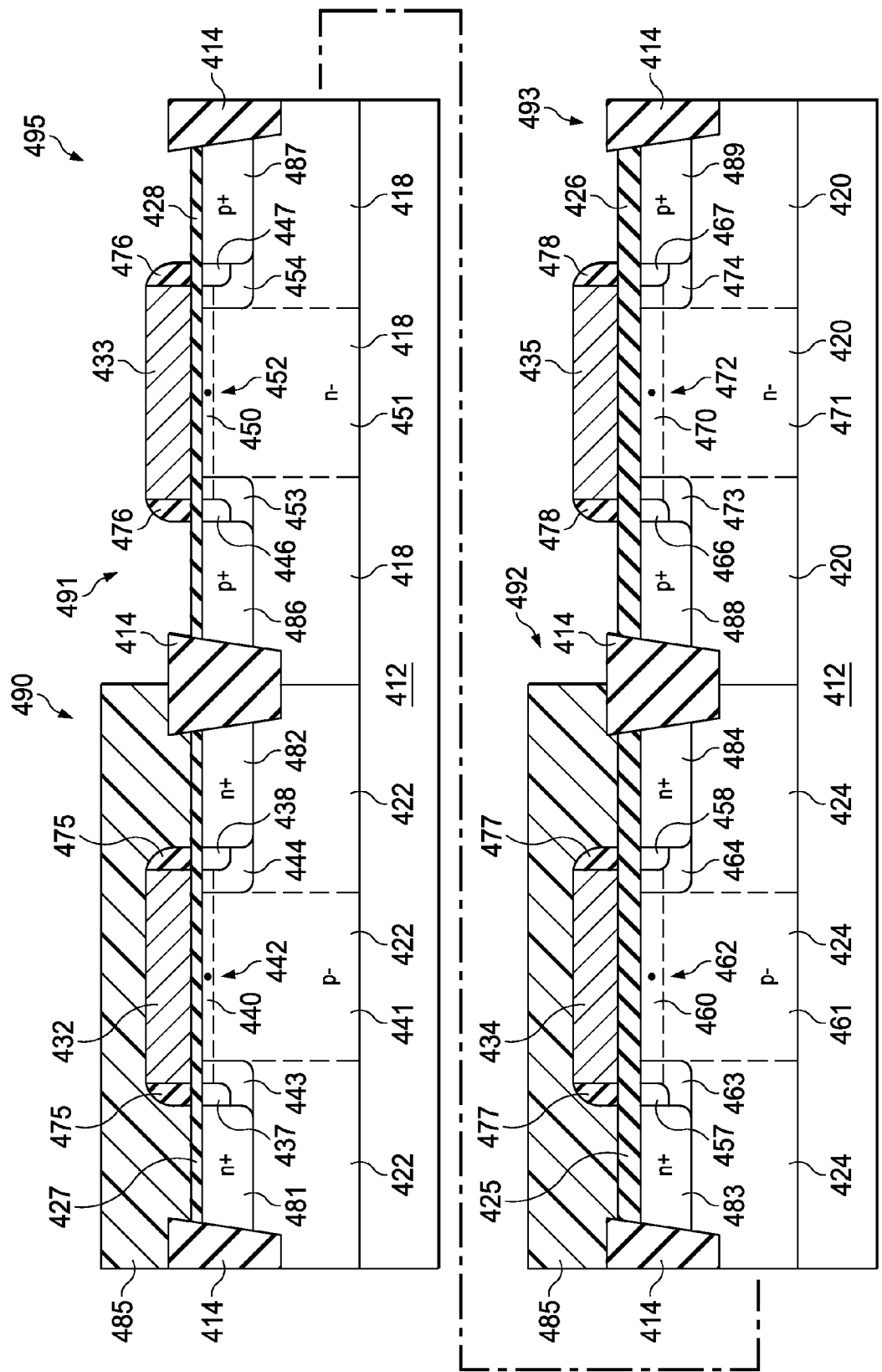

As shown in FIG. 4A, after the n+ source and drain regions for the core and I/O NMOS transistors have been formed, method 400 next moves to step 402-16 to form p+ source and drain regions for the core and I/O PMOS transistors. As shown in FIG. 4I, the p+ source and drain regions for the core and I/O NMOS transistors can be formed by first forming a patterned photoresist layer 485 in a conventional fashion.

Patterned photoresist layer 485 touches gate structures 432 and 434, and overlies to protect the p-type wells 422 and 424. After patterned photoresist layer 485 has been formed, acceptor-type impurity atoms are conventionally implanted through an opening in layer 485 into the n-type wells 418 and 420.

The implant forms a p+ source region 486 that touches source extension region 446, and a p+ drain region 487 that touches drain extension region 447. The implant also forms a p+ source region 488 that touches source extension region 466, and a p+ drain region 487 that touches drain extension region 467. Following this, patterned photoresist layer 485 is removed in a conventional manner.

After the n+ source regions 481 and 483, the n+ drain regions 482 and 484, the p+ source regions 486 and 488, and the p+ drain regions 487 and 489 have been formed, the n+ source regions 481 and 483, the n+ drain regions 482 and 484, the p+ source regions 486 and 488, and the p+ drain regions 487 and 489 are driven in (e.g., annealed at 1100° C. in a neutral ambient such as $N_2$). Method 400 then continues with conventional steps to complete the formation of the CMOS structure.

None of the drive ins are sufficient to cause acceptor-type impurity atoms from p-type source 446/486 and p-type drain 447/487 to diffuse over to the middle point 452 of n-type channel region 450. As a result, n-type channel region 450 at the middle point 452 is substantially free of acceptor-type impurity atoms.

Also, none of the drive ins are sufficient to cause acceptor-type impurity atoms from p-type source 466/488 and p-type drain 467/489 to diffuse over to the middle point 472 of n-type channel region 470. As a result, n-type channel region 470 at the middle point 472 is substantially free of acceptor-type impurity atoms.

Further, none of the drive ins are sufficient to cause donor-type impurity atoms from n-type source 437/481 and n-type drain 438/482 to diffuse over to the middle point 442 of p-type channel region 440. As a result, p-type channel region 440 at the middle point 442 is substantially free of donor-type impurity atoms.

Similarly, none of the drive ins are sufficient to cause donor-type impurity atoms from n-type source 457/483 and n-type drain 458/484 to diffuse over to the middle point 462 of p-type channel region 460. As a result, p-type channel region 460 at the middle point 462 is substantially free of donor-type impurity atoms.

Figure 6:
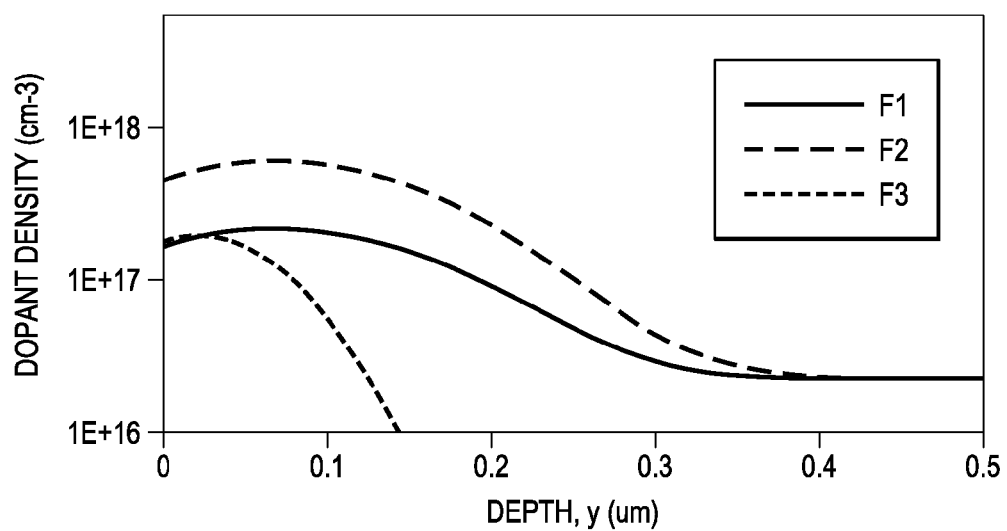
FIG. 6 is a graph illustrating the dopant profile of an NMOS I/O well below an overlying gate structure in accordance with the present invention.

FIG. 6 shows a graph that illustrates the dopant profile of an NMOS I/O well below an overlying gate structure in accordance with the present invention. As shown in FIG. 6, line F1 illustrates the concentration of acceptor-type impurity atoms under gate 434 in NMOS I/O well 424. (Alternately, line F1 illustrates the concentration of acceptor-type impurity atoms under gate 237 in NMOS I/O well 224.) Further, as shown in the graph, there are no donor-type impurity atoms under gate 434 in NMOS I/O well 424 (or under gate 237 in NMOS I/O well 224). By comparison, as also shown in FIG. 6, line F2 illustrates the concentration of acceptor-type impurity atoms, while line F3 represents the concentration of donor-type impurity atoms under the gate of an NMOS I/O well which has been counter doped as in one of the prior art approaches.

P-type well 422, p-type channel region 440, p-type below-the-channel region 441, p-type halo 443, p-type halo 444, n-type source 437/481, n-type drain 438/482, gate dielectric structure 427, gate structure 432, and sidewall spacer 475 define a core NMOS transistor 490, which can be used to implement NMOS transistor 133.

Further, n-type well 418, n-type channel region 450, n-type below-the-channel region 451, n-type halo 453, n-type halo 454, p-type source 446/486, p-type drain 447/487, gate dielectric structure 428, gate structure 433, and sidewall spacer 476 define a core PMOS transistor 491, which can be used to implement PMOS transistor 172.

In addition, p-type well 224, p-type channel region 460, p-type below-the-channel region 461, p-type halo 463, p-type halo 464, n-type source 457/483, n-type drain 458/484, gate dielectric structure 425, gate structure 434, and sidewall spacer 477 define an I/O NMOS transistor 492, which can be used to implement NMOS transistor 340.

Further, n-type well 420, n-type channel region 470, n-type below-the-channel region 471, n-type halo 473, n-type halo 474, p-type source 466/488, p-type drain 467/489, gate dielectric structure 426, gate structure 435, and sidewall spacer 478 define an I/O PMOS transistor 493, which can be used to implement PMOS transistor 380. The transistors 490, 491, 492, and 493, in turn, form a dual gate dielectric CMOS structure 495.

It should be understood that the above descriptions are examples of the present invention, and that various alternatives of the invention described herein may be employed in practicing the invention. Thus, it is intended that the following claims define the scope of the invention and that structures and methods within the scope of these claims and their equivalents be covered thereby.

What is claimed is:

1. A method of forming a semiconductor structure comprising:
    forming a first mask that exposes a first well and a first gate to a first implant, and protects a second well and a second gate from the first implant, the first well and the second well being formed in a semiconductor substrate, a thin gate dielectric touching and lying between the first well and the first gate, a thick gate dielectric touching and lying between the second well and the second gate, the first and second wells including a first type of impurity atoms, being substantially free of a second type of impurity atoms, and having substantially identical dopant profiles when the first mask is formed;
    implanting the second type of impurity atoms through the first mask into the first well to form a first source extension region and a first drain extension region that lies spaced apart from the first source extension region, the first well including a first channel region that lies between the first source extension region and the first drain extension region, the first channel region having a first middle point that lies mid-way between the first source extension region and the first drain extension region, the first channel region at the first middle point including the first type of impurity atoms, being substantially free of the second type of impurity atoms, and having an average dopant concentration; and
    implanting the first type of impurity atoms through the first mask, the first gate, and the thin gate dielectric into the first channel region to raise the average dopant concentration of the first channel region.

2. The method of claim 1 and further comprising implanting the first type of impurity atoms through the first mask at a number of angles to form a first halo that touches the first source extension region and a second halo that touches the first drain extension region.

3. The method of claim 1 and further comprising:
    forming a second mask that exposes the second well and the second gate to a second implant, and protects the first well and the first gate from the second implant;
    implanting the second type of impurity atoms through the second mask into the second well to form a second source extension region and a second drain extension region that lies spaced apart from the second source extension region, the second well including a second channel region that lies between the second source extension region and the second drain extension region, the second channel region having a second middle point that lies mid-way between the second source extension region and the second drain extension region, the second channel region at the second middle point including the first type of impurity atoms, being substantially free of the second type of impurity atoms, and having an average dopant concentration that is less than the average dopant concentration of the first channel region at the first middle point.

4. The method of claim 3 and further comprising implanting the first type of impurity atoms through the second mask at a number of angles to form a third halo that touches the second source extension region and a fourth halo that touches the second drain extension region.

5. The method of claim 3 wherein no impurity atoms are implanted through the second gate and the thick gate dielectric into the second channel region.

6. The method of claim 5 wherein:
the first well includes a first below-the-channel region that touches and lies below the first channel region, the first below-the-channel region having a dopant profile; and
the second well includes a second below-the-channel region that touches and lies below the second channel region, the second below-the-channel region having a dopant profile that is substantially identical to the dopant profile of the first below-the-channel region.

\* \* \* \* \*